United States Patent
Ono et al.

(10) Patent No.: US 8,304,764 B2
(45) Date of Patent: Nov. 6, 2012

(54) ORGANIC ELECTROLUMINESCENT ELEMENT

(75) Inventors: Takeshi Ono, Hino (JP); Kunimasa Hiyama, Hachioji (JP); Shigeru Kojima, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 274 days.

(21) Appl. No.: 12/739,864

(22) PCT Filed: Oct. 27, 2008

(86) PCT No.: PCT/JP2008/069441
§ 371 (c)(1),
(2), (4) Date: Apr. 26, 2010

(87) PCT Pub. No.: WO2009/057549
PCT Pub. Date: May 7, 2009

(65) Prior Publication Data
US 2010/0244007 A1  Sep. 30, 2010

(30) Foreign Application Priority Data
Oct. 29, 2007 (JP) .................. 2007-280040

(51) Int. Cl.
*H01L 35/24* (2006.01)
(52) U.S. Cl. .................. 257/40; 257/E51.001
(58) Field of Classification Search .................... 257/40, 257/E51.001
See application file for complete search history.

(56) References Cited

U.S. PATENT DOCUMENTS
2006/0220011 A1 * 10/2006 Kitamura et al. ............... 257/40

FOREIGN PATENT DOCUMENTS
| JP | 6-207170 A | 7/1994 |
|---|---|---|
| JP | 7-41759 A | 10/1995 |
| JP | 2006-310815 A | 11/2006 |
| JP | 2007-226983 A | 9/2007 |
| JP | 2007-251097 A | 9/2007 |
| WO | 2007/086216 A1 | 8/2007 |

OTHER PUBLICATIONS

International Search Report for International application No. PCT/JP2008/069441 with English translation mailed Dec. 22, 2008.

* cited by examiner

*Primary Examiner* — Anthony Ho
(74) *Attorney, Agent, or Firm* — Cantor Colburn LLP

(57) ABSTRACT

The present invention provides a white organic electroluminescent element which can emits white light and is free from deviation of chromaticity. This organic electroluminescent element comprises a substrate and, provided on the substrate, at least an anode, a cathode, and a light emitting layer held between the anode and the cathode. This organic electroluminescent element is characterized in that the light emitting layer contains at least three types of light emitting materials different from each other in λ max, and the absolute value of HOMO level of the light emitting material having the shortest wavelength is smaller than the absolute value of HOMO level of the other light emitting materials.

15 Claims, No Drawings

ORGANIC ELECTROLUMINESCENT ELEMENT

This is a U.S. National Phase Application under 35 U.S.C. 371 of International Application PCT/JP2008/069441, filed on Oct. 27, 2008.

This application claims the priority of Japanese application No. 2007-280040, filed on Oct. 29, 2007, the entire content of which is hereby incorporated by reference.

TECHNICAL HELD

The present invention relates to an electroluminescent element.

BACKGROUND

A demand for a surface light emitting element requiring low power consumption with small volume has been enhanced, and an electroluminescent element (hereinafter, referred to as an EL element) draws attention as the surface light emitting element. A constituent element of an ELD includes such as an inorganic electroluminescent element and an organic electroluminescent element (hereinafter, referred to as an organic EL element).

The organic EL element emits light in such way that high electric field is acted to emitting part, and electrons are accelerated in the high electric field to come into collision to emission center whereby the emission center is activated to make light emission, generally.

In the organic EL element, an electron and a hole are respectively injected into a light emitting layer from electron injection electrode and hole injection electrode, the organic material is raised to excited state by combination of the injected electron and hole, and light is emitted when the organic material come back from the excited state to the ground state. The organic EL element has an advantage capable of lower voltage operation than the inorganic organic EL element. It is expected to develop to a thin and flexible display and lighting usage utilizing advantage of surface light emission. White light organic EL element is expected to develop in back light of a liquid crystal display or lighting.

Several methods of constituting light emitting layer are known to produce the white light organic EL element, for example, Patent Documents 1 and 2 are cited. A method to compose the light emitting layer by plural layers containing each of BGR emitting materials, and a method compose the light emitting layer by single layer containing BGR emitting materials are known.

Positive hole is trapped by a guest material having smaller absolute value of HOMO level and electron is trapped by a guest material having larger absolute value of HOMO level in case of RGB emitting materials are incorporated in a single emitting layer. HOMO level in longer wave length material has smaller absolute value, and therefore, carrier is trapped by a longer wave length guest material.

Therefore, an amount of dopant for red light which has longer wave length should be less than the amounts of other dopants such as blue or green. The amount of dopant for red light should be less than the amounts of other dopants such as blue or green taking energy transfer into consideration, since energy transfer to longer wave length material occurs between RGB. Consequently, there is problem to deviation of chromaticity occurs due to only slight variation of mixture ratio of dopants, stability in production is insufficient.

Patent document 1: JP-A H6-207170

Patent document 2: JP-A H7-41759

DISCLOSURE OF THE INVENTION

Problem to be Dissolved by the Invention

Accordingly an object of this invention is to provide a white organic electroluminescent element free from deviation of chromaticity.

Means to Dissolve the Problem

The problems described above in this invention are dissolved by the following means.

1. An organic electroluminescent element comprising a substrate and, provided on the substrate, at least an anode, a cathode, and a light emitting layer held between the anode and the cathode, and emitting white light, characterized in that the light emitting layer contains at least three types of light emitting materials different from each other in λ max, and an absolute value of HOMO level of the light emitting material having the shortest wavelength is smaller than the absolute value of HOMO level of the other light emitting materials.

2. The organic electroluminescent element of above described item 1, characterized in that emitting colors of the at least three types of light emitting materials are blue, green and red.

3. The organic electroluminescent element of above described item 1 or 2, characterized in that a content of the light emitting material having the longest wavelength is 0.1 to 20% by weight based on a content of the light emitting material having the shortest wavelength.

4. The organic electroluminescent element of any one of the above described items 1 to 3, characterized in that the absolute value of HOMO level of the light emitting material having the shortest wavelength is not more than 4.4 eV.

5. The organic electroluminescent element of any one of the above described items 1 to 4, characterized in that the light emitting material having the shortest wavelength is a phosphorescent compound represented by Formula (1).

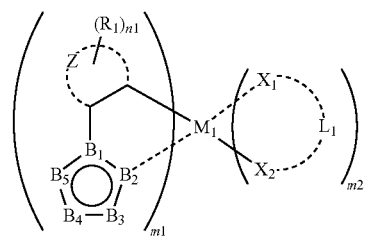

Formula (1)

wherein $R_1$ represents a substituent; Z represents a group of non-metallic atoms which are necessary to form a 5 to 7 member ring; n1 represents an integer of 0 to 5; $B_1$ through $B_5$ each represents a carbon atom, a nitrogen atom, an oxygen atom, or a sulfur atom, while at least one of $B_1$ through $B_5$ represents a nitrogen atom; $M_1$ represents a metal in Groups 8 to 10 of the element periodic table; each of $X_1$ and $X_2$ represents a carbon atom, a nitrogen atom, or an oxygen atom; $L_1$ represents a group of atoms which form a bidentate ligand together with $X_1$ and $X_2$; m1 represents an integer of 1, 2, or 3; and m2 represents an integer of 0, 1, or 2, while m1+m2 is 2 or 3.

6. The organic electroluminescent element of any one of the above described items 1 to 5, characterized in that the light emitting layer is produced by coating process.

7. The organic electroluminescent element of any one of the above described items 1 to 6, characterized in that the light emitting material is a phosphorescent compound.

8. The organic electroluminescent element of any one of the above described items 1 to 5, characterized in that a thickness of the light emitting layer is not less than 15 nm.

Advantage of the Invention

A white organic electroluminescent element free from deviation of chromaticity can be provided by this invention.

MOST PREFERABLE EMBODIMENT TO PRACTICE THE INVENTION

This invention will be detailed below.

A material emitting the shorter wavelength light (a shorter wave length dopant) having a lower absolute value of HOMO level than the absolute value of HOMO level of the other dopants is used in this invention. Effects by the carrier trap to longer dopant reduces by employing lower wave length dopant, and larger amount of long wave length dopant to compose white light emitting element can be used than the conventional art. Accordingly, difference of contents difference between plural dopants can be reduced, and it makes possible to reduce variation of contents ratio. Consequently white light organic EL element with chromaticity stability and production stability can be produced.

In the present invention, the values of the HOMO levels denote the values obtained by calculations using Gaussian 98 (Gaussian 98, Revision A. 11. 4, M. J. Frisch, et al, Gaussian, Inc., Pittsburgh Pa., 2002), which is software for a molecular orbital calculation, and produced by Gaussian Inc. The value of the HOMO levels of the phosphorescent compound of the present invention are defined as values (a converted value in eV unit) calculated via structure optimization employing B3LYP/LanL2DZ as a key word. The reason for the calculated value being considered to be valid is that the calculated value obtained by the above method is in good agreement with the experimental one.

In this invention, the "lower HOMO level" denotes that an absolute value of the HOMO level is lower. For example, in a case where a compound A and a compound B have the HOMO levels of −5.45 eV and −5.30 eV respectively, a compound B is said to have the lower HOMO level compared to a compound A.

<<Layer Arrangement of Organic EL Element>>

The organic EL element of the invention is composed of constitution elements such as a substrate (a supporting base), electrodes, and organic layers having various functions. Preferable concrete examples of the layer constitution of the organic EL element of the invention are listed below, though the invention is not limited to them.

(1) Anode/Light emitting layer/Electron transport layer/Cathode (2) Anode/Positive hole transport layer/Light emitting layer/Electron transport layer/Cathode (3) Anode/Positive hole transport layer/Light emitting layer/Positive hole blocking layer/Electron transport layer/Cathode (4) Anode/Positive hole transport layer/Light emitting layer/Positive hole blocking layer/Electron transport layer/Cathode buffer layer/Cathode (5) Anode/Anode buffer layer/Positive hole transport layer/Light emitting layer/Positive hole blocking layer/Electron transport layer/Cathode buffer layer/Cathode <<Light Emitting Layer>>

The light emitting layer is a layer in which an electron and a hole injected from an electrode, an electron transport layer or a hole transport layer are recombined to emit light. The emitting part may be inside of the emitting layer or interface between the emitting layer and layer adjacent thereto.

The light emitting layer used in this invention includes three or more emitting material having different emitting maximum wave length each other. It is preferable that the emitting colors of the three emitting material are blue, green and red, and the emitting maximum wave length is preferably 430 to 480 nm for blue, 510 to 560 nm for green and 600 to 650 nm for red.

Thickness of the emitting light is not particularly limited and it is preferable to adjust 2 to 200 nm, more preferably not less than 5 nm and not more than 80 nm in view of uniformity of forming layer and preventing unnecessary high voltage application emitting operation. The inventors have found that the thinner the thickness becomes when the thickness is not more than 15 nm, the lower emitting intensity becomes markedly as a result of their study.

The emitting intensity is not lowered markedly when the layers are produced by evaporation method as by a wet process. It is assumed that minute mixture layer is formed between the positive hole transport layer and light emitting layer when the layers are formed by a wet process, excitons generated by combination of electron and hole near the mixture layer move to the mixture layer and the hole transport layer, and are deactivated there. The thickness is preferably set as 10 nm or thicker, more preferably 15 nm or thicker when the light emitting layer is produced by a wet process.

The light emitting layer can be formed by a conventional layer forming method such as a vacuum deposition method, a wet process method (a spin coating method, a cast method, a Langmuir-Blodgett method, an ink jet method spray method and a printing method. The light emitting layer is preferably formed by a wet process to maintain stability of producing since the light emitting layer contains a light emitting material which is used in low content.

(Host Compound)

As used herein, a "host compound" incorporated in the light emitting layer of the organic EL element according to the present invention refers to the compound which allows a light emitting compound to emit light in such a manner that energy of excitons formed via recombination of carriers on the above compound is transferred to light emitting compounds (light emitting dopants: guest compounds) and also allows a light emitting compound to emit light in such a manner that carriers on the above host compound are trapped by the above light emitting compound, followed by formation of excitons on the above light emitting compound.

In the present invention, the ratio of the host compound is preferably at least 20% by weight with respect to the compounds incorporated in the light emitting layer.

With regard to host compounds, conventional host compounds may be employed individually or in combinations of a plurality of types. By employing a plurality of types of host compounds, it is possible to regulate movement of electric charges, whereby it is possible to enhance the efficiency of organic EL elements. Further, by employing a plurality of types of phosphor emitting compounds which are employed as the light emitting dopant described below, it becomes possible to mix different colors of emitted light, whereby it is possible to obtain any of the colors of emitted light. It is possible to select the type of phosphorescence emitting compounds and regulate the amount of the dope, whereby application to lighting and backlights becomes possible.

Structures of the light emitting host compounds employed in the present invention are not particularly limited. Representative examples include carbazole derivatives, triarylamine derivatives, aromatic borane derivatives, nitrogen-containing heterocyclic compounds, thiophene derivatives, furan derivatives, compounds having a basic skeleton of oligoarylene compounds, carboline derivatives, diazacarbazole derivatives (those in which at least one of the carbon atoms of the hydrocarbon ring which constitutes a carboline ring of carboline derivatives is replaced with a nitrogen atom).

The compounds represented by following Formula (a) are preferred as the host compound employed in the light emitting layer according to the present invention.

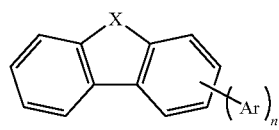

Formula (a)

In above Formula (a), X represents NR', O, S, CR'R", or SiR'R", wherein R' and R" each represents a hydrogen atom or a substituent; Ar represents an aromatic ring and n represents an integer of 0 to 8.

In X of Formula (a), substituents represented by each of R' and R" include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group, a 1-propenyl group, a 2-butenyl group, a 1,3-butandienyl group, a 2-pentenyl group, and an isopropenyl group), an alkynyl group (for example, an ethynyl group and a propargyl group), an aromatic hydrocarbon ring group (also called as an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group), an aromatic heterocyclic ring group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbonyl group, a diazacarbazolyl group (being a group in which one of the carbon atoms which constitute the carboline ring of the above carbolinyl group is replaced with a nitrogen atom), and a phthalazinyl group), a heterocyclyl group (for example, a pyrrolidyl group, an imidazolidyl group, a morpholyl group, and an oxazolydyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group, and a 2-pyridylureido group), a sulfonyl group (for example, a methylsulfinyl group, an ethylsulfonyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butyl sulfonyl group, a cyclohexylsulfonyl group, a 2-ethylhexylsulfonyl group, and a dodecylsulfonyl group), an arylsulfonyl group or heteroarylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, a silyl group (for example, a trimethylsilyl group, a triisopropylsilyl group, a triphenylsilyl group, and a phenyldiethylsilyl group), and a phosphono group.

These substituents may further be substituted with any of the above substituents, and a plurality of these substituents may bond to each other to form a ring.

In Formula (a), preferred X is either NR' or O, and an aromatic hydrocarbon group, and an aromatic heterocyclyl group is particularly preferred as R'.

In Formula (a), the aromatic ring represented by Ar includes an aromatic hydrocarbon ring and an aromatic heterocyclic ring. Further, the above aromatic ring may be either a single ring or a condensed ring, and may have no substituent or the substituent described below.

In Formula (a), listed as the aromatic hydrocarbon ring represented by Ar are a benzene ring a biphenyl ring, a naphthalene ring, an azulene ring, an anthracene ring, a phenanthrene ring, a pyrene ring, a chrysene ring, a naphthacene ring, a triphenylene ring, an o-terphenyl ring, an o-terphenyl ring, a p-terphenyl ring, an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring, and an anthraanthrene ring. These rings may further have substituents.

In Formula (a), listed as the aromatic heterocyclic ring represented by Ar are, for example, a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (in which one of the carbon atoms of the hydrocarbon ring constituting a carboline ring is further replaced with a nitrogen atom). These rings may further have substituents.

Of the above rings, those, which are preferably employed, as the aromatic ring represented by Ar, are the carbazole ring the carboline ring, the dibenzofuran ring, and the benzene ring. Of these, those, which are more preferably employed, are the carbazole ring, the carboline ring, and though benzene ring.

Of the above, preferred is the benzene ring having a substituent and particularly preferred is the benzene ring having a carbazolyl group.

Further, in Formula (a), each of the condensed rings of at least three rings, as shown below, is one of the preferred embodiments. Specific examples of aromatic hydrocarbon condensed rings which are formed via condensation of at least three rings include a naphthacene ring, an anthracene ring, a tetracene ring, a pentacene ring, a hexacene ring, a phenanthrene ring, a pyrene ring, a benzopyrene ring, a benzazulene ring, a chrysene ring, a benzochrysene ring, an acenaphthene ring, an acenaphthylene ring, a triphenylene ring, a coronene ring, a benzocoronene ring, a hexabenzocoronene ring, a fluorene ring, a benzofluorene ring, a fluoranthene ring, a perylene ring, a naphthoperylene ring, a pentabenzopyrene ring, a benzopyrene ring, a pentaphene ring, a picene ring, a pyranthorene ring, a coronene ring, a naphthocoronene ring, an ovalene ring, and an anthraanthorene ring.

These rings may further have a substituent.

Further, specifically listed as aromatic heterocyclic rings formed via condensation of at least three rings are an acridine ring, a benzoquinoline ring, a carbazole ring, a carboline ring, a phenazine ring, a phenanthridine ring, a phenanthroline ring, a carboline ring, a cyclazine ring, a quindoline ring, a thepenidine ring, a quinindoline ring, a triphenodithiazine ring, a triphenedioxazine ring, a phenantrazine ring, an anthrazine ring, a perymidine ring, a diazacarbazole ring (referring to the compound in which any one of carbon atoms constituting a carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthorene ring, a phenoxathiin ring, a thiophanthorene ring (being a naphthothiophene ring). These rings may have a substituent.

In Formula (a), substituents which may be incorporated in the aromatic ring represented by Ar are R' and R" which are as defined as above.

Further, in Formula (a), n represents an integer of 0 to 8, but is preferably 0 to 2. Particularly, when X is O or S, n is preferably 1 or 2.

In Formula (a), substituents which may be incorporated in the aromatic ring represented by Ar are R' and R" which are as defined as above.

Specific examples of the light emitting host compounds represented by Formula (a) will now be shown; however, the present invention is not limited thereto.

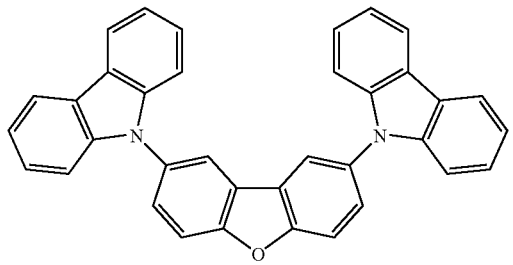

1-1

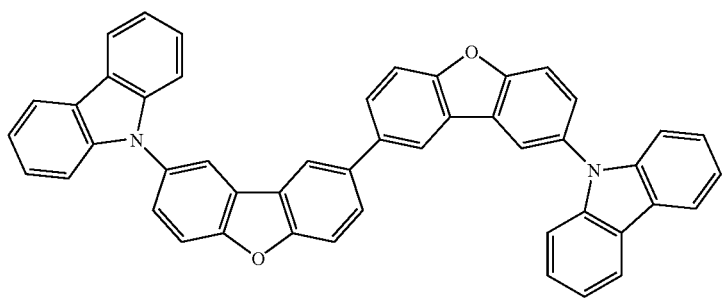

1-2

-continued
1-3
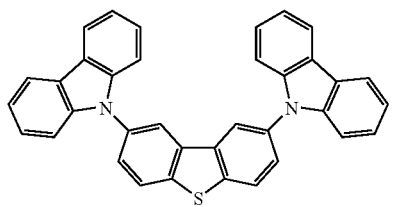
1-4
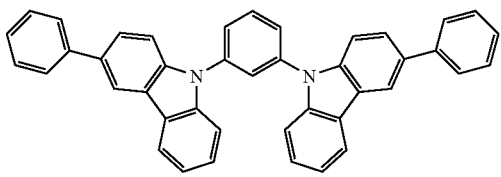
1-5
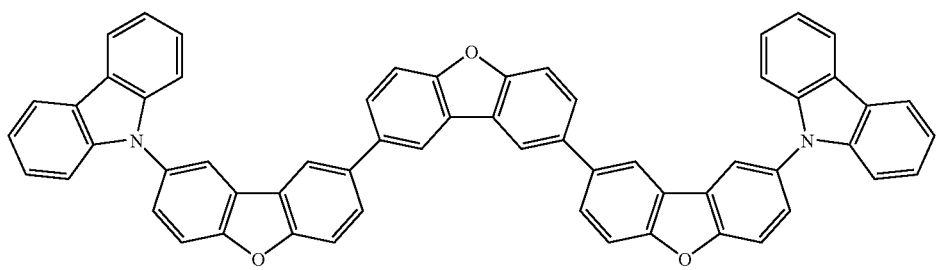
1-6
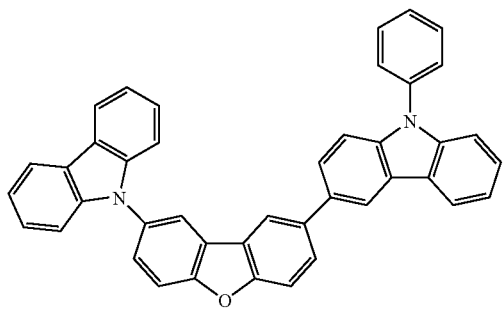
1-7
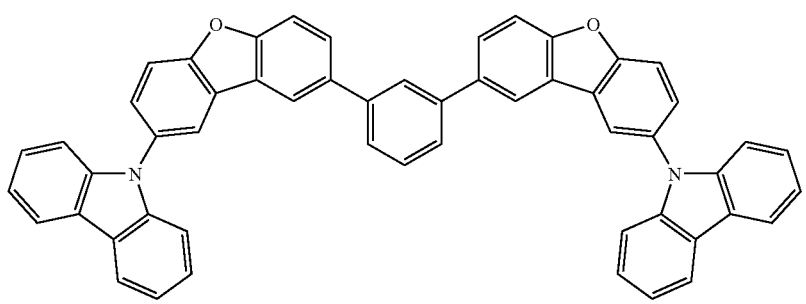
1-8
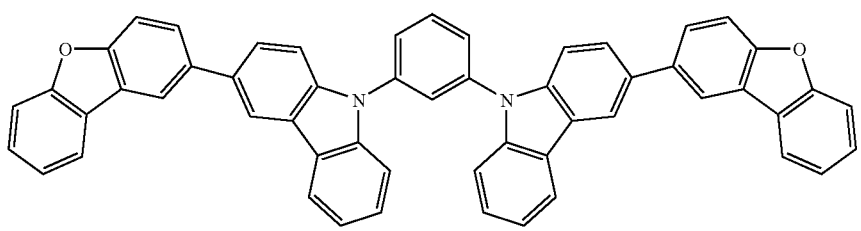
1-9
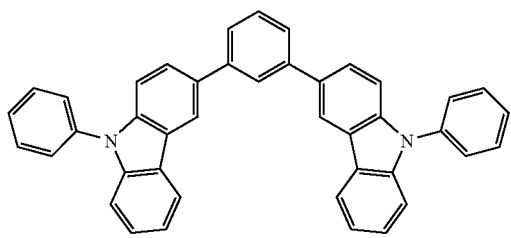
1-10
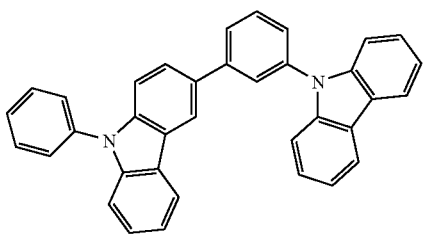

-continued
1-11
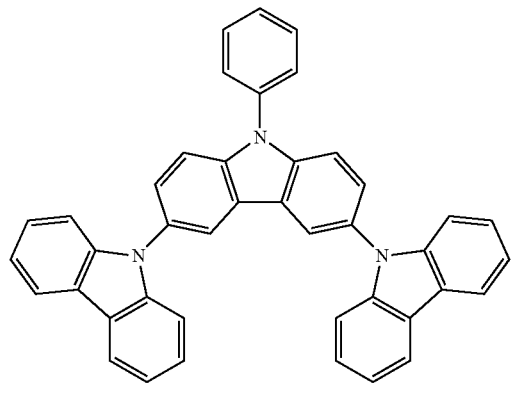
1-12
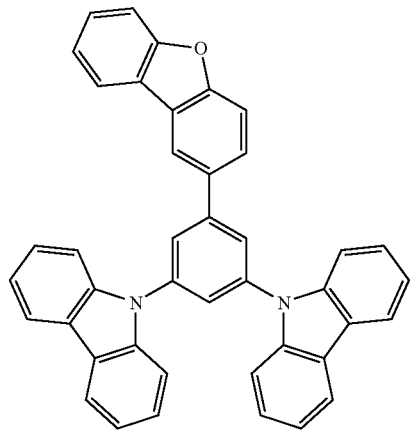
1-13
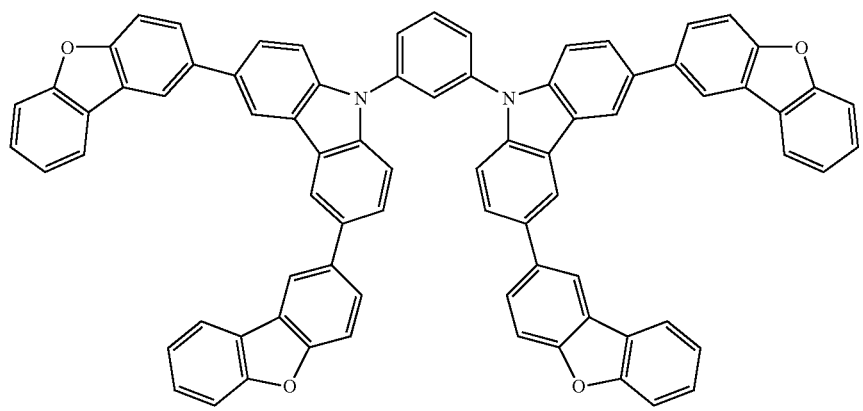
1-14
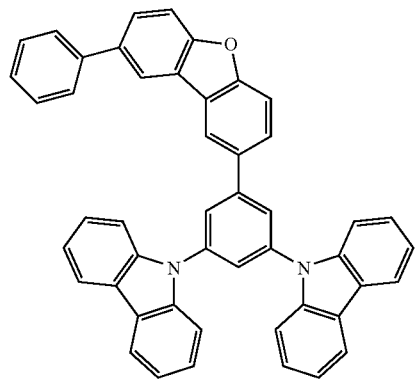
1-15
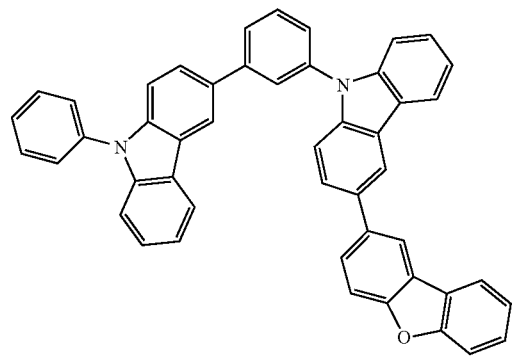
1-16
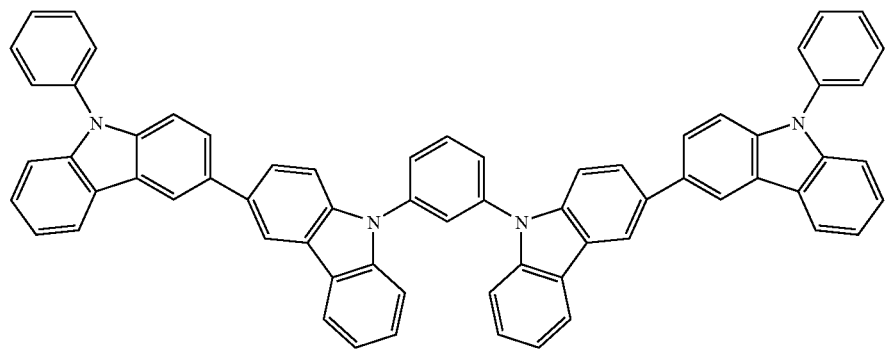

-continued
1-17
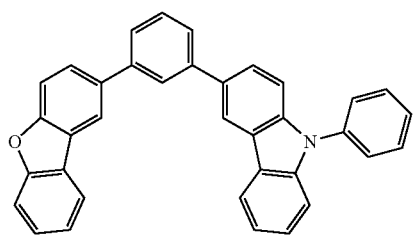
1-18
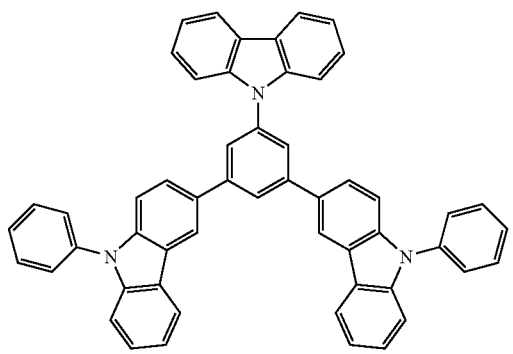
1-19
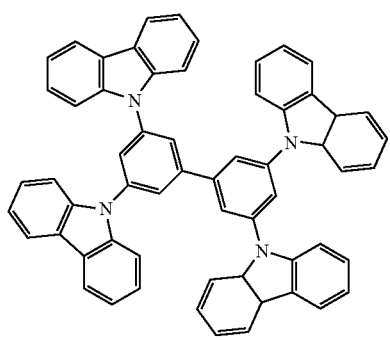
1-20
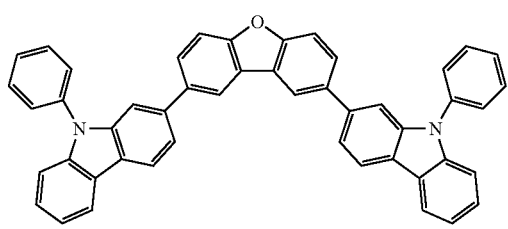
1-21
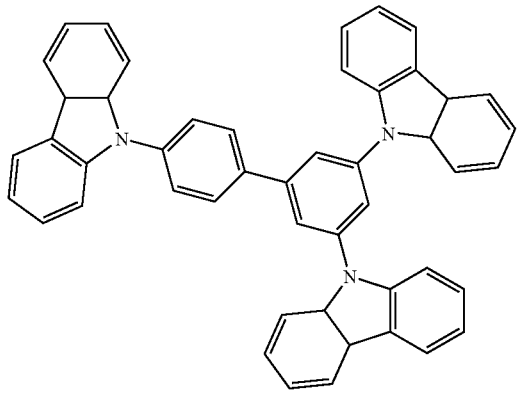
1-22
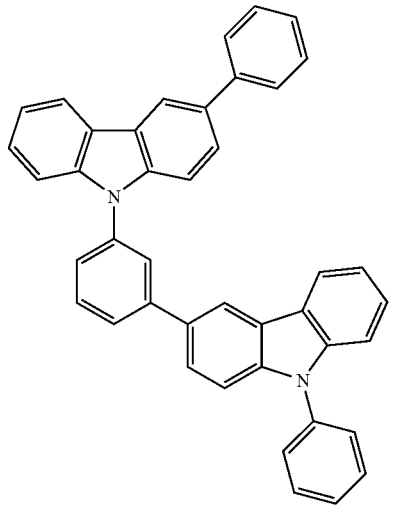
1-23
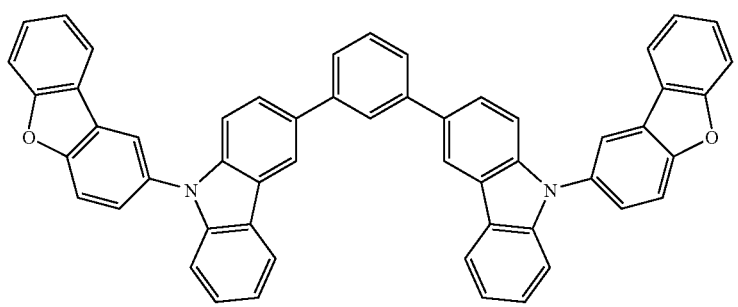

-continued
1-24
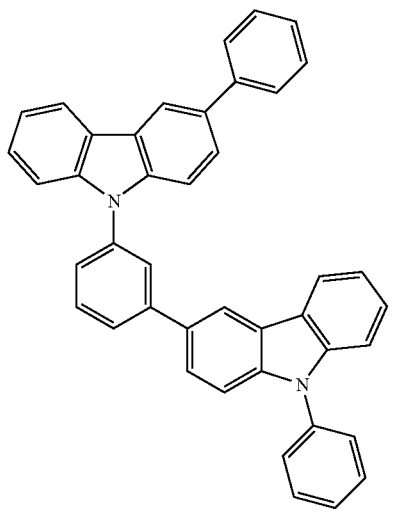
1-25
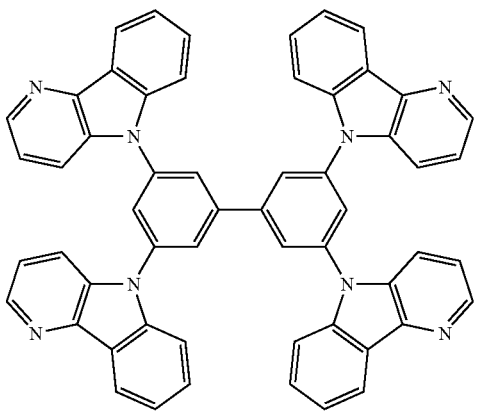
1-26
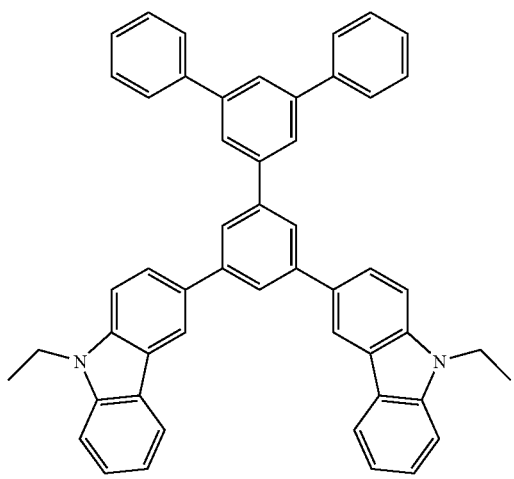
1-27
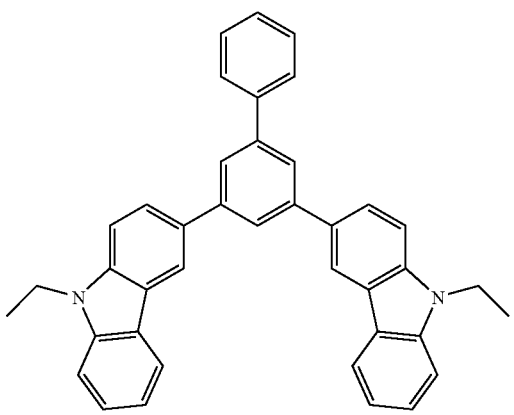
1-28
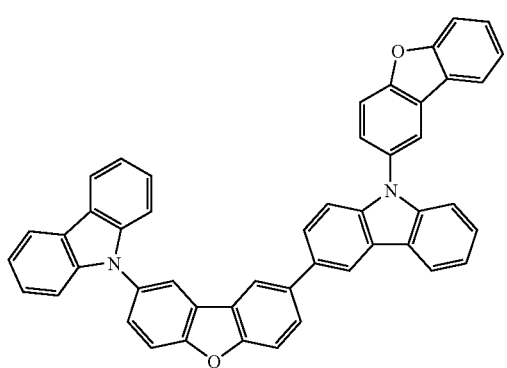
1-29
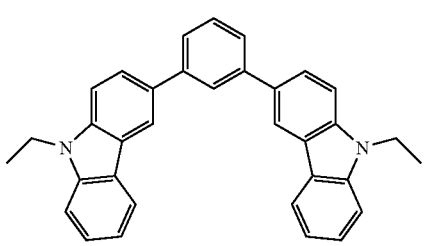

-continued
1-30
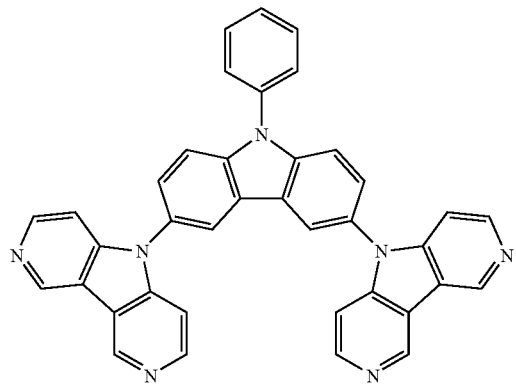
1-31
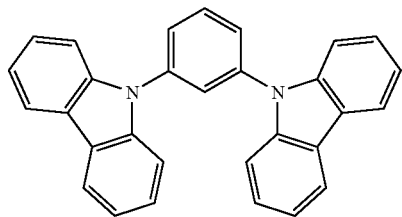
1-32
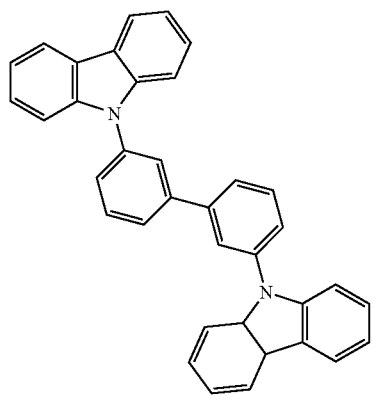
1-33
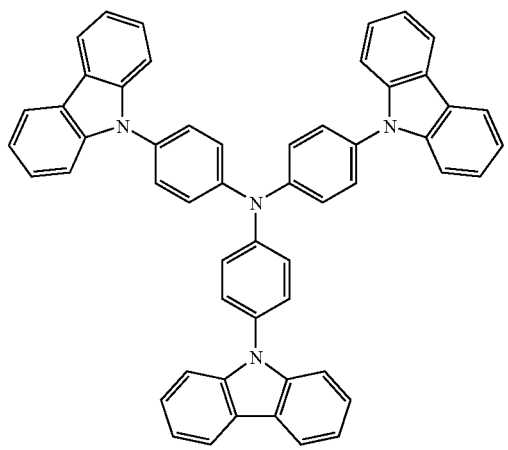
1-34
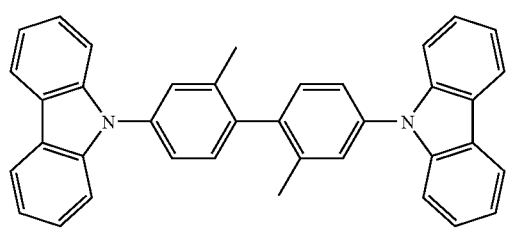
1-35
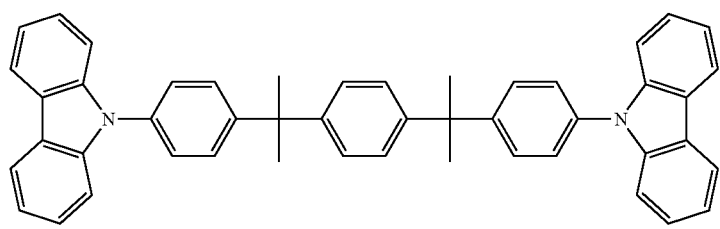
1-36
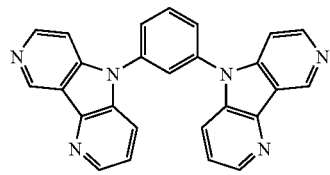
1-37
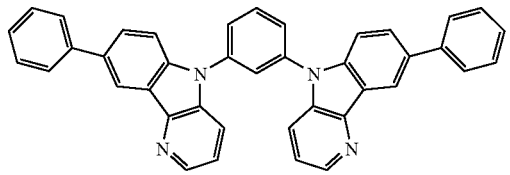

1-38
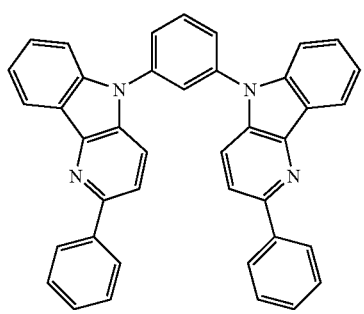
1-39
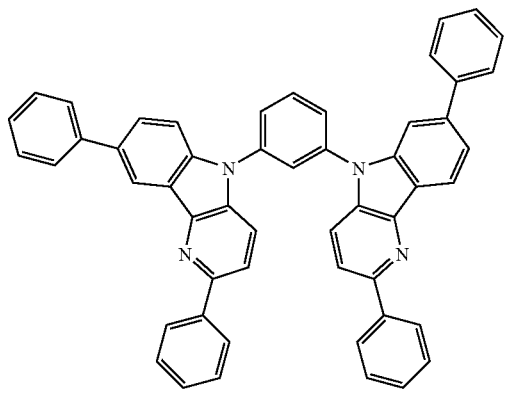
1-40
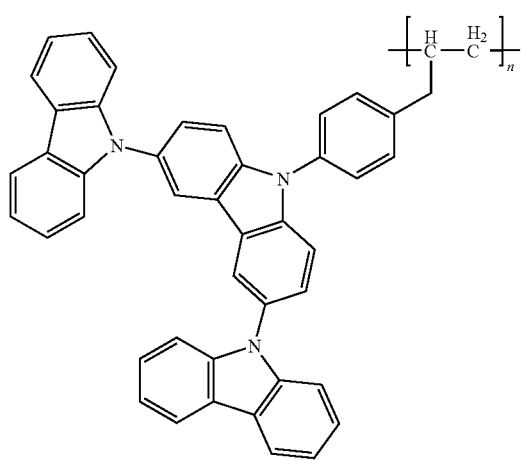
1-41
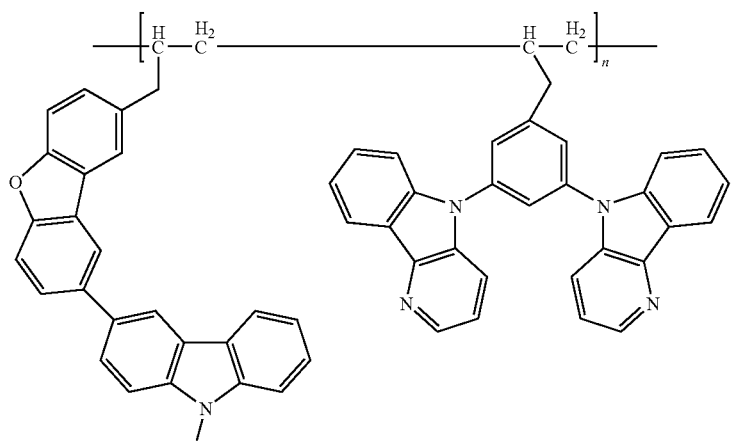

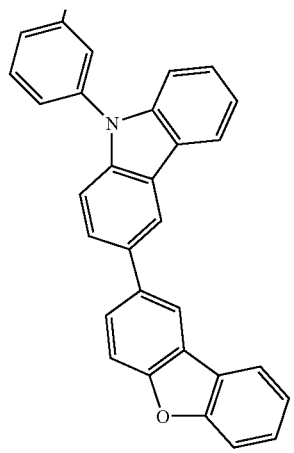

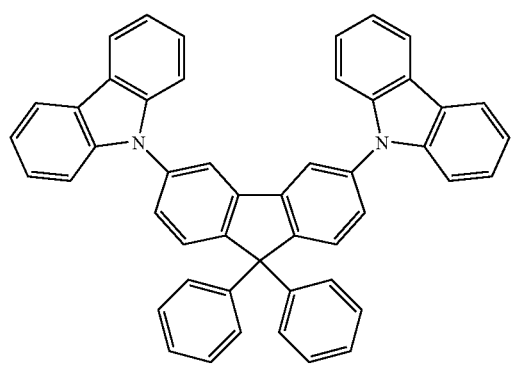

1-42

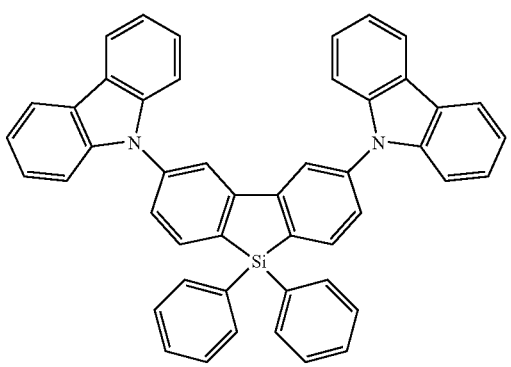

1-43

Further, the host compound employed in the present invention may be a low molecular weight compound or a polymer compound having repeated units, as well as a low molecular weight compound (a vapor deposition polymerizable light emitting host) having a polymerizable group such as a vinyl group or an epoxy group.

As for the host compound, a preferable compound is one having positive hole transport ability and electron transport ability, and preventing prolong of wavelength of emitting light and having high glass transition point (Tg).

Conventionally known host compounds may be used in combination for the host compounds according to this invention. When plural host compounds are employed, charge transfer can be adjusted and an organic EL panel can be made higher efficiency. It is possible to mix different emitting light by employing plural phosphorescent compounds, and optional emitting color can be obtained. White emitting light can be obtained by selecting and adjusting kinds of phosphorescent compound and amount of dope, and it is possible to apply to lighting and backlight.

Further, specific examples of appropriate host compounds known in the art include the compounds described in the following documents; for example, JP-A 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

(Light Emitting Dopants)

As light emitting dopants according to the present invention employed may be fluorescent compounds, phosphorescence emitting materials (hereinafter also referred to as phosphorescent compounds and phosphorescence emitting compounds). In view of preparing organic EL elements of higher light emitting efficiency, it is preferable that the host compound described above is incorporated as a light emitting dopant employed in the light emitting layer of the organic EL element of the present invention (referred to also "an emitting material"), as well as at least one phosphorescence emitting material is incorporated as the light emitting dopant.

(Phosphorescence Emitting Materials)

The phosphorescence emitting materials according to the present invention are defined in such a manner that light emission is observed from the excited triplet, and specifically, compounds emit phosphorescence at room temperature (25° C.), while the phosphorescent quantum yield is at least 0.01 at 25° C. The phosphorescent quantum yield is preferably at least 0.1.

It is possible to determine the above phosphorescent quantum yield by employing for example, the methods described on page 398 of Bunko (Spectroscopy) II of Dai 4 Han Jikken Kagaku Koza (4th Edition Experimental Chemistry Lectures) (1992 Edition, Maruzen). It is possible to determine the phosphorescent quantum yield in a solution by employing various solvents, and the phosphorescence emitting materials according to the present invention are acceptable when the above phosphorescent quantum yield (at least 0.01) is achieved in any of the solvents.

As a light emitting principle of phosphorescence emitting materials, two types are listed. Namely, one type is an energy transfer type in which recombination of carriers occurs on the host compounds onto which the above carries are transported, resulting in formation of the excited state of the above host compounds, and light emission is generated by transferring the above energy to the phosphorescence emitting materials, while the other type is a carrier trap type in which phosphorescence emitting materials function as a carrier trop, resulting in recombination of the carriers in the phosphorescence emitting materials and light emission is generated from the phosphorescence emitting materials. In either case, the condition should be that energy of the excited state of phosphorescence emitting materials is lower than that of the host compounds. The phosphorescence emitting materials can be used selected from conventional compound used in the light emitting layer of the organic EL.

The phosphorescence emitting materials according to the present invention are complex based compounds which incorporate preferably metals in Groups 8-10 of the element periodic table, more preferably iridium compounds, osmium compounds, platinum compounds (platinum complex based compounds), and rare earth metal complexes, and of these, most preferred are iridium compounds. The compound for red light is preferably selected from iridium compounds.

The phosphorescence emitting compounds represented by Formula (1) will now be detailed.

<<Phosphorescence Emitting Compounds Represented by Formula (1)>>

In the phosphorescent compounds represented by above Formula (1) according to the present invention, examples of the substituents represented by $R_1$ include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called as an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group), an aromatic heterocyclic ring group (for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group, a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacabazolyl group (being a group in which one of the carbon atoms which constitute the carboline ring of the above carbolinyl group is replaced with a nitrogen atom), a quinoxalinyl group, a pyridazinyl group, a triazinyl group, a quinazolinyl group, and a phthalazinyl group), a heterocyclyl group (for example, a pyrrolidyl group, an imidazolidyl group, a morpholyl group, and an oxazolidyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group and a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (for example, a methylsulfonyl group, an ethylsulfonyl group, a butyl sulfonyl group, a cyclohexylsulfonyl group, a 2-ethylhexylsulfonyl group and a dodecylsulfonyl group), an arylsulfonyl or heteroarylsulfonyl group (for example, a phenylsulfonyl group, a naphthylsulfonyl group, a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group), a cyano group, a nitro group, a hydroxyl group, a mercapto group, and a silyl group (for example, a trimethylsilyl group, a triisopropylsilyl group, a triphenylsilyl group, and a phenyldiethylsilyl group).

Of these substituents, preferred is the alkyl or aryl group.

Z represents a group of non-metallic atoms which are necessary to form a 5- to 7-membered ring. Examples of the 5- to 7-membered rings formed via Z include a benzene ring, a naphthalene ring, a pyridine ring, a pyrimidines ring, a pyrrole ring, a thiophene ring, a pyrazole ring, an imidazole ring, an oxazole ring and a thiazole ring. Of these, preferred is the benzene ring.

$B_1$-$B_5$ each represents a nitrogen atom, an oxygen atom, or a sulfur atom, while at least one of them represents the nitrogen atom. A single ring is preferred as the aromatic nitrogen-containing heterocyclic ring which is composed of these 5 atoms. Examples thereof include a pyrrole ring, a pyrazole ring, an imidazole ring, a triazole ring, a tetrazole ring, an oxazole ring, an isoxazole ring, a thiazole ring, an isothiazole ring, an oxadiazole ring and a thiadiazole ring. Of these, preferred are the pyrazole ring and the imidazole ring, and more preferred is the imidazole ring. These rings may be substituted with any of the above substituents. The alkyl group and the aryl group are preferred as the above substituent and the aryl group is more preferred.

$L_1$ represents a group of atoms which form a bidentate ligand together with $X_1$ and $X_2$. Specific examples of the bidentate ligands represented by $X_1$-$L_1$-$X_2$ include a substituted or unsubstituted phenylpyridine, phenylpyrazole, phenylimidazole, phenyltriazole, phenyltetrazole, pyrazabole, picolinic acid, and acetylacetone. These rings may be substituted with any of the above substituents.

"m1" represents an integer of 1, 2, or 3, and m2 represents an integer of 0, 1, or 2, while sum of m1 and m2 equal 2 or 3. Of these, the case in which m2 represents 0 is preferred.

As the metals represented by $M_1$ employed may be transition metals of Groups 8 through 10 in the element periodic table. Of these, iridium and platinum are preferred, while iridium is more preferred.

The phosphorescence emitting compounds represented by Formula (1) may have neither a polymerizable group nor a reactive group.

Further, in above Formula (1), it is preferable that the nitrogen-containing heterocyclic ring formed by $B_1$ to $B_5$ is an imidazole ring.

Still further, when the nitrogen-containing heterocyclic ring formed by $B_1$ to $B_6$ is an imidazole ring, it is preferable that above Formula (1) is represented by following Formula (2).

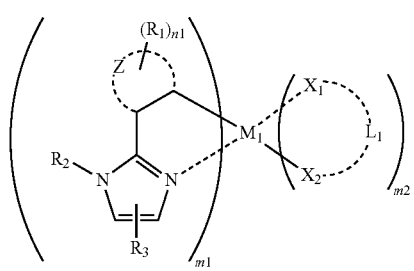

Formula (2)

In above Formula (2), $R_1$, $R_2$, and $R_3$ each represents a substituent; Z represents a group of non-metallic atoms which are necessary to form a 5 to 7-membered ring $M_1$ is a transition metal of Groups 8 to 10 in the element periodic table. Each of $X_1$ and $X_2$ represents a carbon atom, a nitrogen atom, or an oxygen atom; $L_1$ represents a group of atoms which form a bidentate ligand together with $X_1$ and $X_2$; m1 represents an integer of 1, 2, or 3; and m2 represents an integer of 0, 1, or 2, while sum of m1 and m2 equal 2 or 3.

In Formula (2), the substituent represented by $R_1$, $R_2$, or $R_3$ is as defined for the substituent represented by $R_1$ in above Formula (1); further, each of Z, $M_1$, $X_1$, $X_2$, and $L_2$ is also as defined for each in above Formula (1); and each of m1 and m2 is as defined above.

Further, preferred as the group represented by $R_2$ in Formula (2) is any one of the aromatic hydrocarbon ring groups (being aromatic carbon rings). Of these, a substituted aryl group is preferred, and preferred as the substituted aryl group is the group represented by following Formula (3).

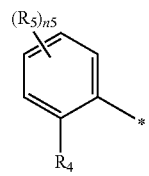

Formula (3)

In Formula (3), $R_4$ represents a substituent which exhibits a steric parameter value (being an Es value) and is at most −0.5. $R_5$ is the same as $R_1$, while n5 represents an integer of 0 to 4. Here, "*" represents the bonding position.

"Es value", as described herein, is a steric parameter which is derived from chemical reactivity. It is possible to state that the smaller this value, the more three-dimensionally bulky the substituent is.

The Es value will now be described. In the hydrolysis reaction of ester in an acidic condition, it is known that it is sufficient to consider only steric hindrance of a substituent for its effects on the reaction progress.

For example, the Es value of substituent X is determined by the following formula.

In the formula, kX represents a reaction rate constant during hydrolysis under an acidic condition, as shown in the following reaction formula, of α-position monosubstituted acetic acid ester derived from α-position monosubstituted acetic acid, which is prepared by substituting the methyl group of acetic acid with substituent X;

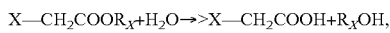

$$X-CH_2COOR_X+H_2O \rightarrow X-CH_2COOH+R_XOH,$$

while kH represents a reaction rate constant during hydrolysis under an acidic condition, as shown in the following reaction formula, of the acetic acid ester which corresponds to the above α-position monosubstituted acetic acid ester;

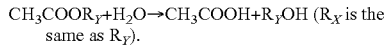

$$CH_3COOR_Y+H_2O \rightarrow CH_3COOH+R_YOH \text{ } (R_X \text{ is the same as } R_Y).$$

$$Es = \log(kX/kH)$$

The reaction rate decreases with increasing the steric hindrance of the substituent X. As a result, kX is smaller than kH, which means that Es values are always negative values. Es values can be obtained from experimental values of kX and kH as describe above.

Specific examples of the Fs values are detailed in Unger, S. H. and Hansch, C., Prog. Phys. Org. Chem., 12, 91 (1976). Further, specific numeral values are listed in "Yakubutsu no Kozo Kassei Sokan (Structure Active Correlation of Medicines)" (Kagaku no Ryoiki Zokan No. 122, Nankodo), and "American Chemical Society Professional Reference Book, 'Exploring QSAR' p. 81 Table 3-3". Some of these will be listed in Table 1.

TABLE 1

| Substituent | Es Value |
|---|---|
| H | 0 |
| F | −0.46 |
| Cl | −0.97 |
| Br | −1.16 |
| I | −1.4 |
| CH$_3$ | −1.24 |
| C$_2$H$_5$ | −1.31 |
| n-C$_3$H$_7$ | −1.6 |
| n-C$_4$H$_9$ | −1.63 |
| i-C$_4$H$_9$ | −2.17 |
| s-C$_4$H$_9$ | −2.37 |
| t-C$_4$H$_9$ | −2.78 |
| cyclo-C$_4$H$_7$ | −1.3 |
| n-C$_5$H$_{11}$ | −1.64 |
| i-C$_5$H$_{11}$ | −1.59 |
| CH(C$_2$H$_5$)$_2$ | −3.22 |
| cyclo-C$_6$H$_{11}$ | −2.03 |
| CH$_2$F | −1.48 |
| CH$_2$Cl | −1.48 |
| CH$_2$Br | −1.51 |
| CH$_2$I | −1.61 |
| CH$_2$OH | −1.21 |
| CH$_2$OCH$_3$ | −1.43 |
| CH$_2$NO$_2$ | −2.71 |
| CH$_2$COCH$_3$ | −1.99 |
| CHF$_2$ | −1.91 |
| CHCl$_2$ | −2.78 |
| CHBr$_2$ | −3.1 |
| CHOHCH$_3$ | −1.15 |
| CF$_3$ | −2.4 |
| CCl$_3$ | −3.3 |
| CBr$_3$ | −3.67 |

TABLE 1-continued

| Substituent | Es Value |
|---|---|
| C(C$_6$H$_5$)$_3$ | −5.92 |
| CH=CH$_2$ | −2.84 |
| CN | −0.51 |
| OH | −0.55 |
| OCH$_3$ | −0.55 |
| SH | −1.07 |
| SCH$_3$ | −1.07 |
| SF$_5$ | −2.91 |
| NH$_2$ | −0.61 |

It should be noted that Es values defined in the present invention are obtained as follows. The Es value of a methyl group is not defined as "0", but that of a hydrogen atom is defined as "0". The Es value of the present invention is obtained by subtracting 1.24 from the Es value when the Es value of a methyl group is "0".

In the present invention, R$_4$ represents a substituent which exhibits a steric parameter value (an Es value) of at most −0.5, preferably −7.0 to −0.6, but more preferably −7.0 to −1.0.

Further, in the present invention, when it is possible that, for example, keto-enol tautomers are present in R$_4$, the Es value of the keto portion is converted as the enol tautomer. When other tautomers exist, the Es value is obtained via the same conversion method.

Specific examples of the phosphorescence emitting compounds represented by Formula (1) or (2) of the present invention will now be listed, however the present invention is not limited thereto.

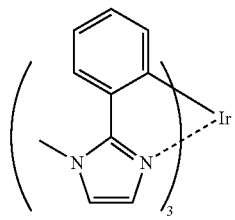

1-1

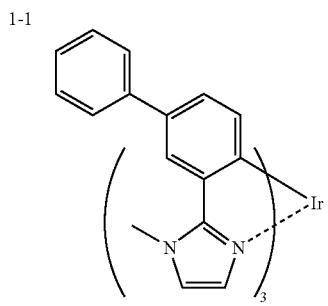

1-2

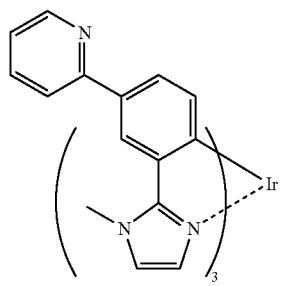

1-3

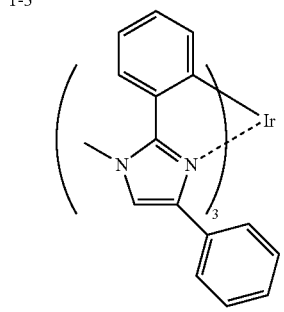

1-4

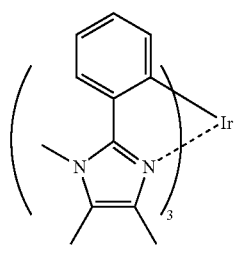

1-5

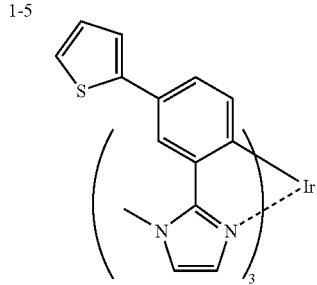

1-6

-continued
1-7
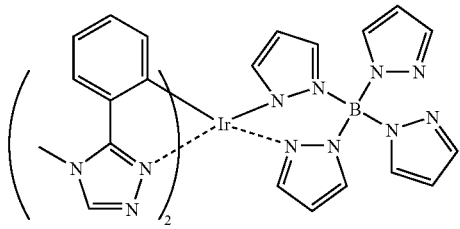
1-8
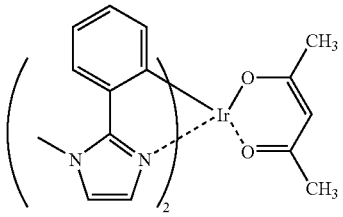
1-9
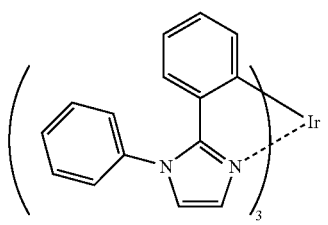
1-10
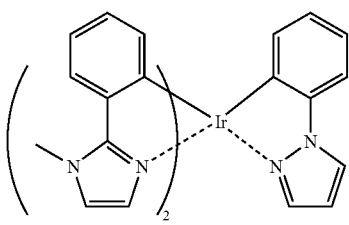
1-11
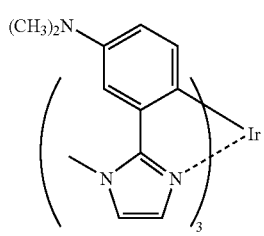
1-12
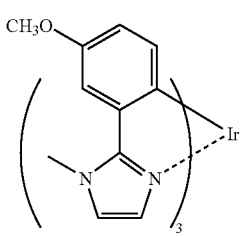
1-13
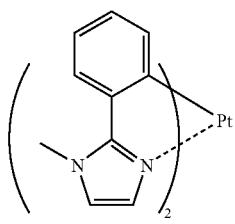
1-14
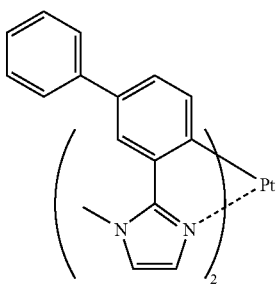
1-15
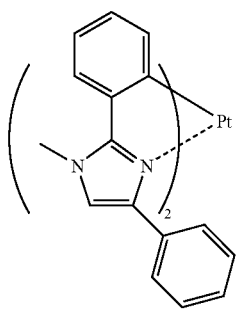
1-16
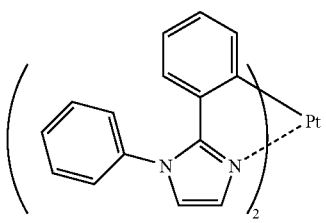
1-17
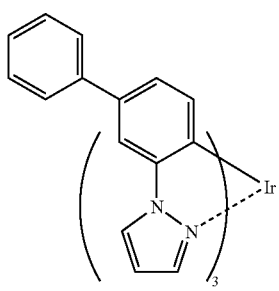
1-18
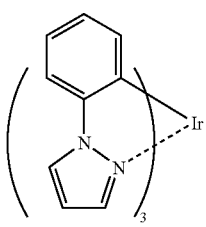

-continued
1-19
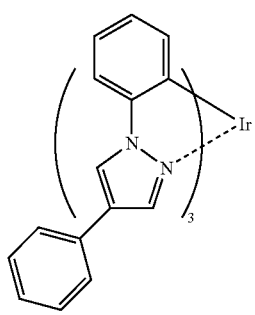
1-20
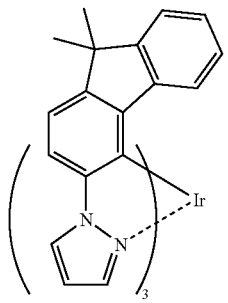
1-21
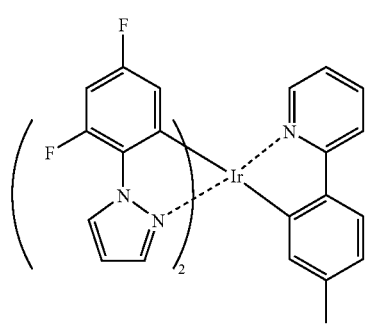
1-22
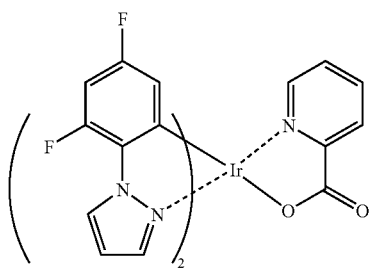
1-23
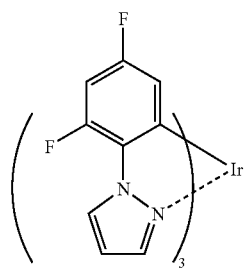
1-24
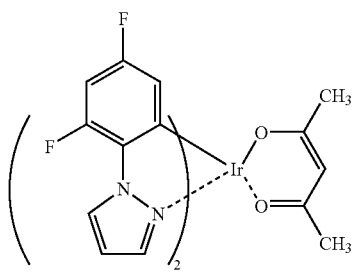
1-25
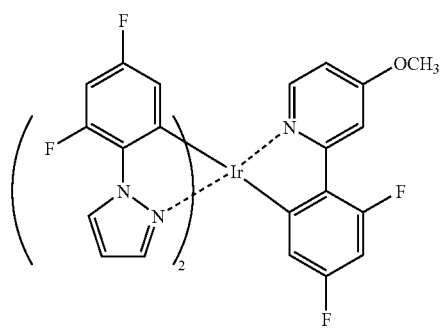
1-26
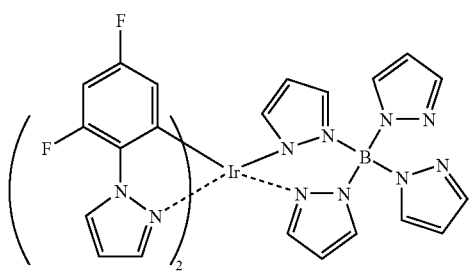
1-27
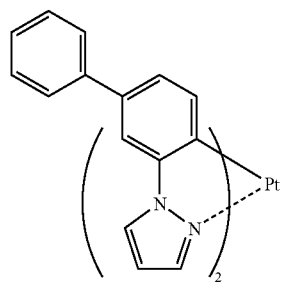
1-28
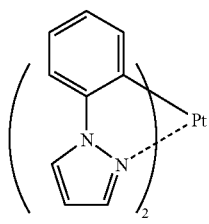

-continued
1-29
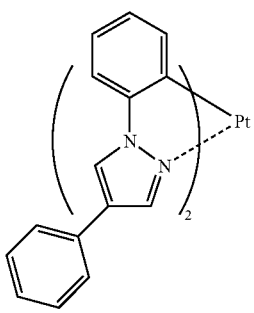
1-30
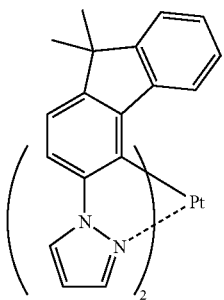
1-31
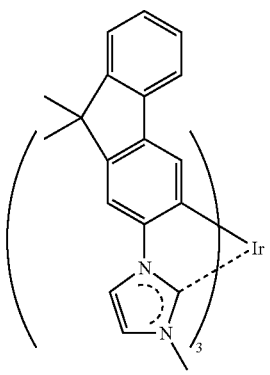
1-32
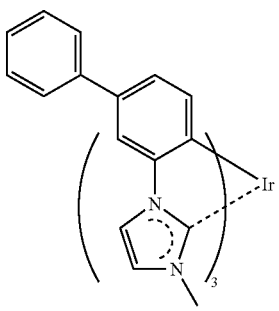
1-33
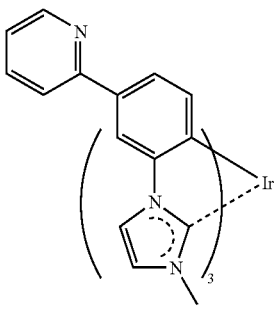
1-34
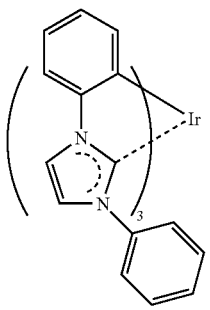
1-35
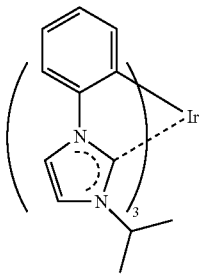
1-36
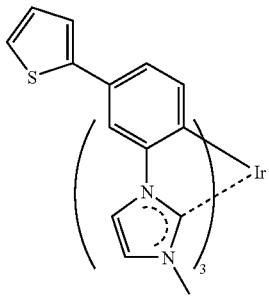
1-37
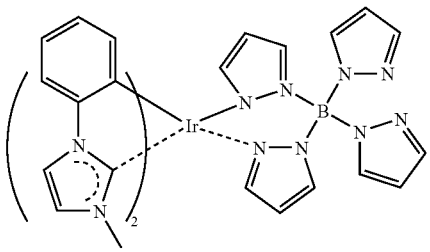
1-38
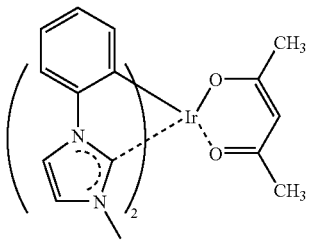

-continued
1-39
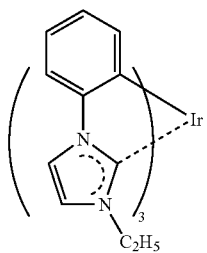
1-40
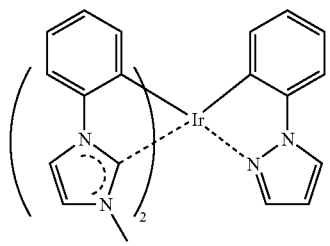
1-41
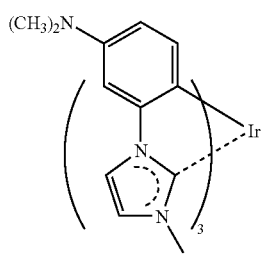
1-42
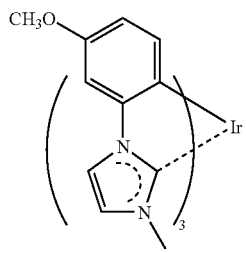
1-43
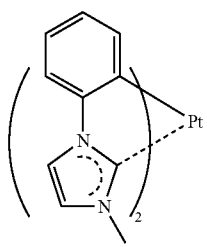
1-44
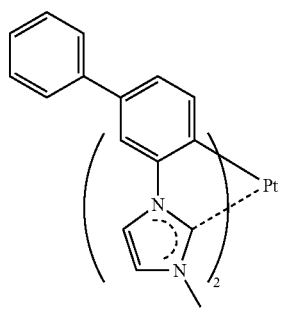
1-45
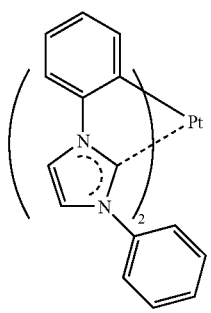
1-46
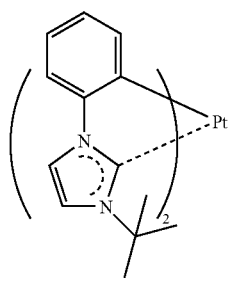
1-47
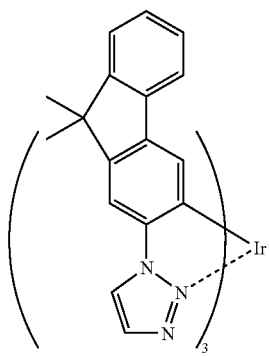
1-48
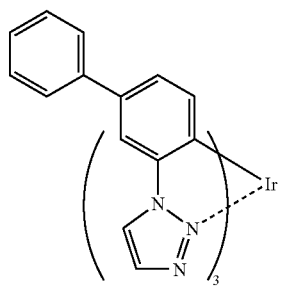

-continued
1-49
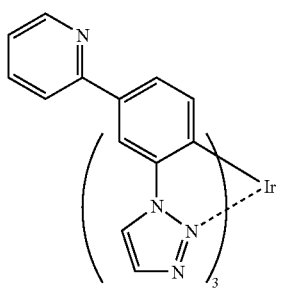
1-50
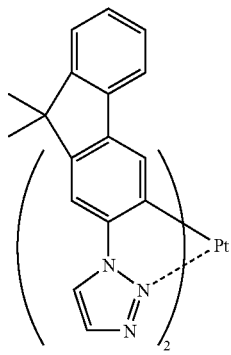
1-51
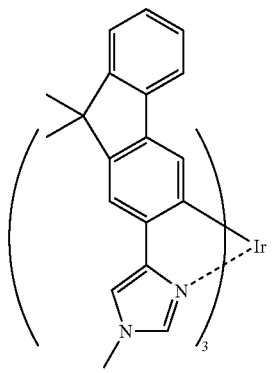
1-52
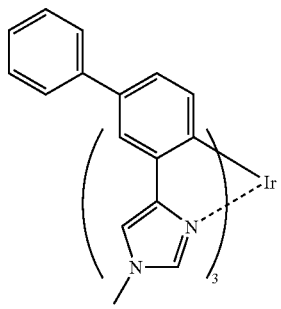
1-53
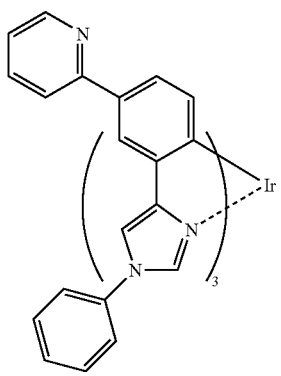
1-54
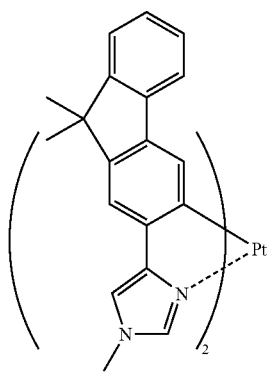
1-55
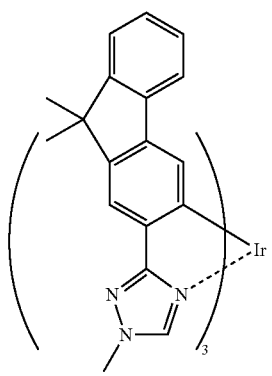
1-56
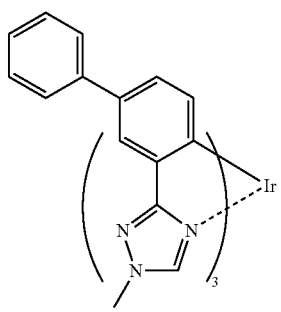

-continued
1-57 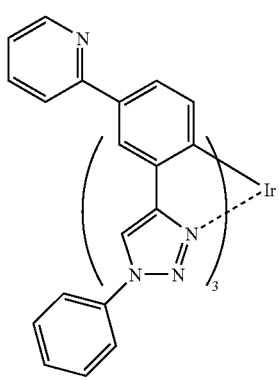
1-58 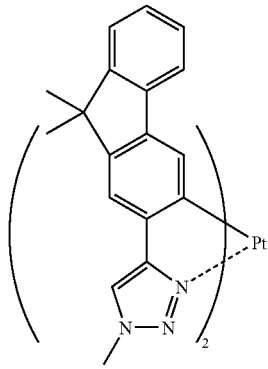
1-59 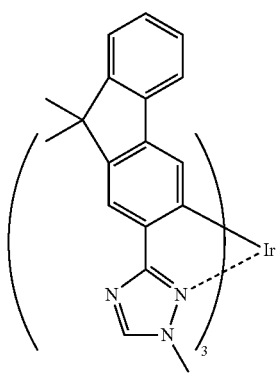
1-60 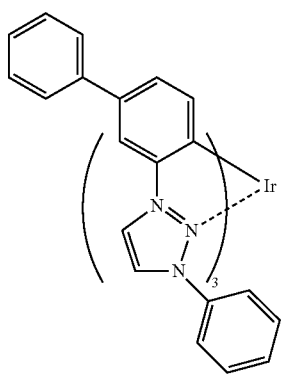
1-61 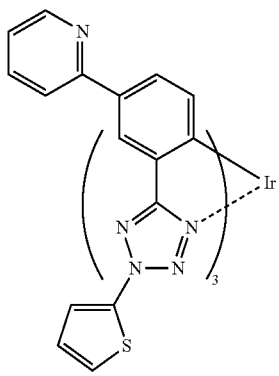
1-62 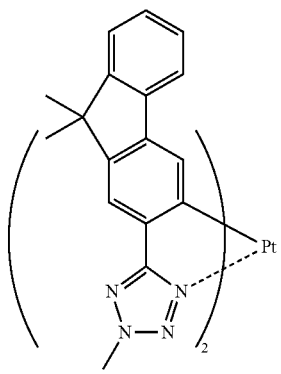
1-63 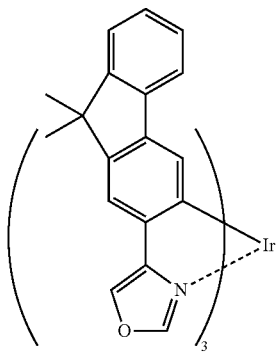
1-64 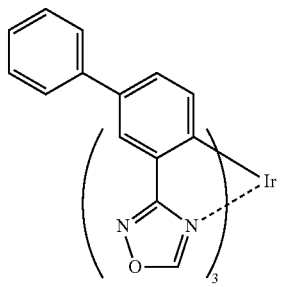

-continued
| | |
|---|---|
| 1-65 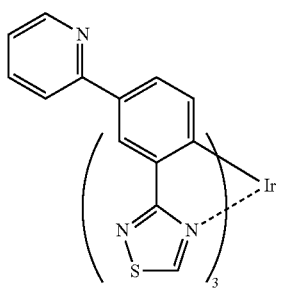 | 1-66 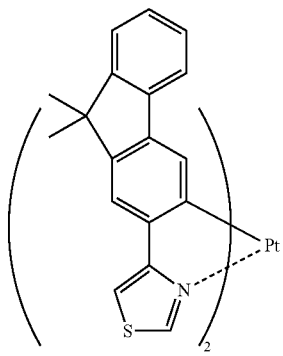 |
| 1-67 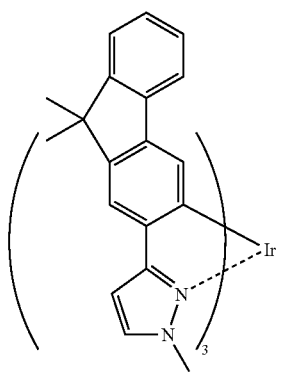 | 1-68 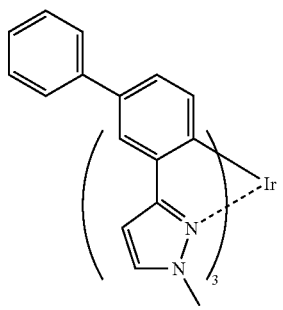 |
| 1-69 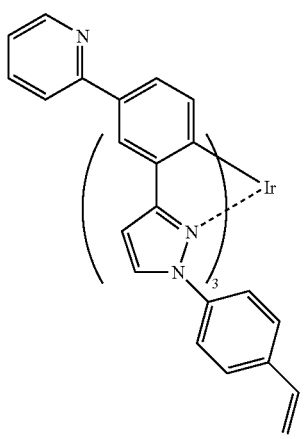 | 1-70 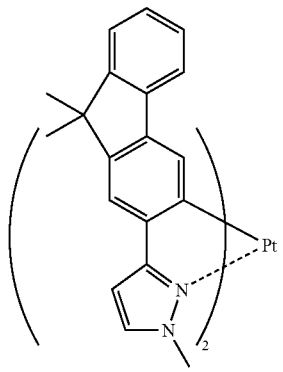 |
| 1-71 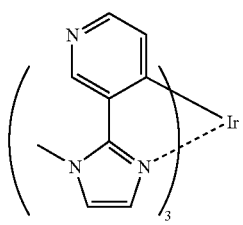 | 1-72 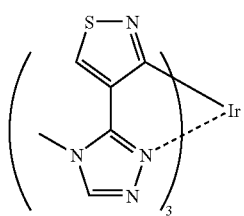 |

1-73
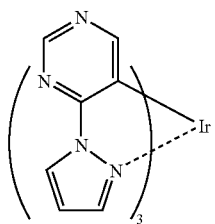
1-74
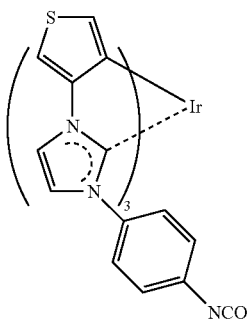
1-75
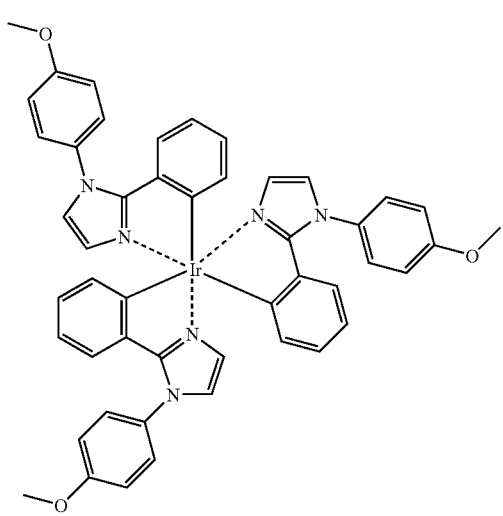
1-76
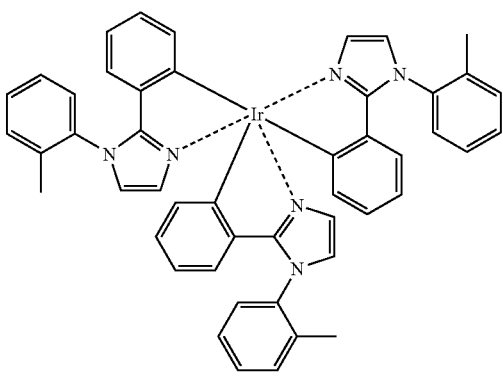
1-77
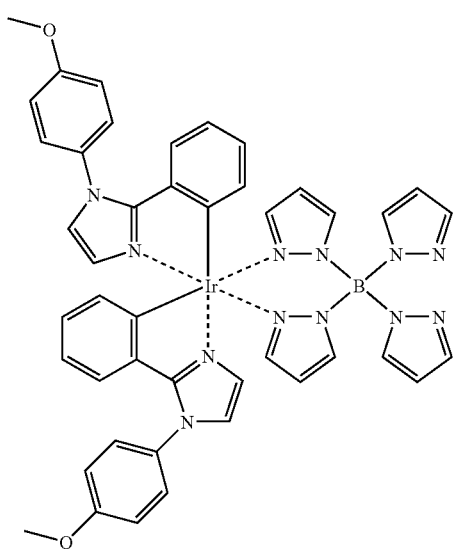
1-78
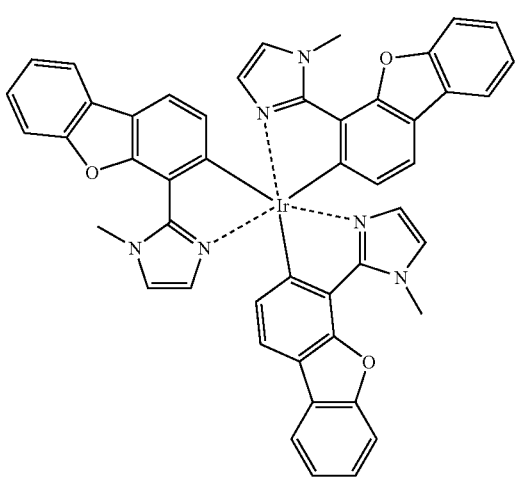

-continued
1-79
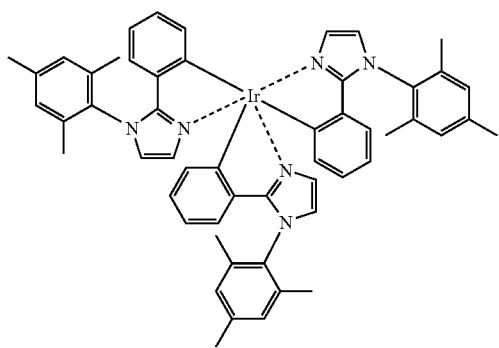
1-80
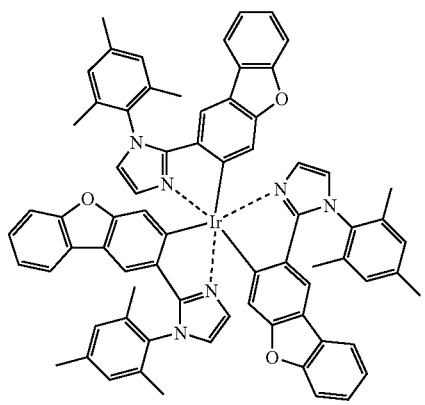
1-81
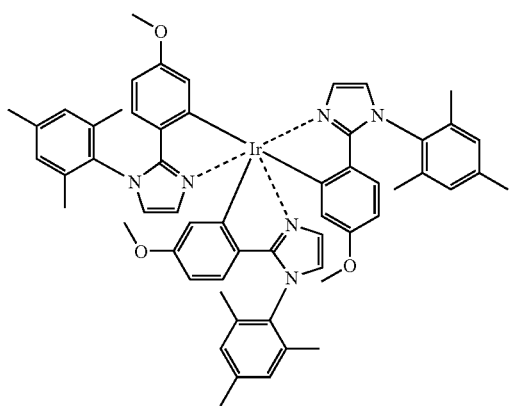
1-82
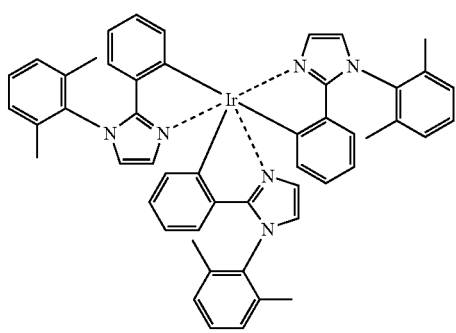
1-83
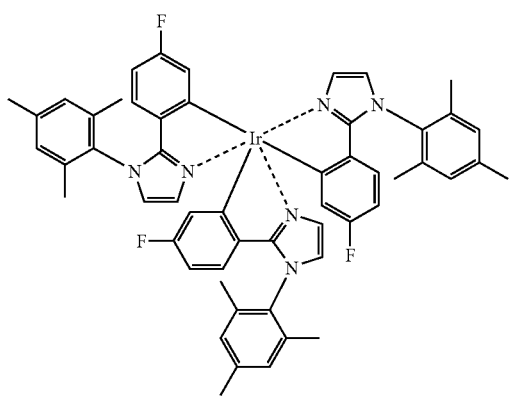
1-84
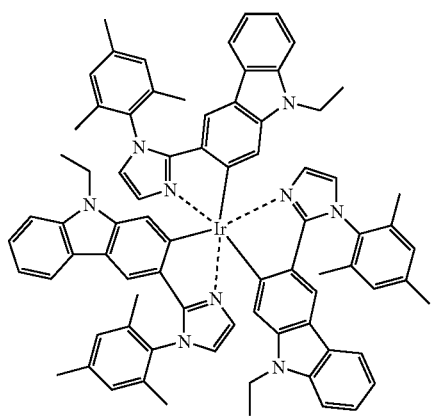

-continued
1-85
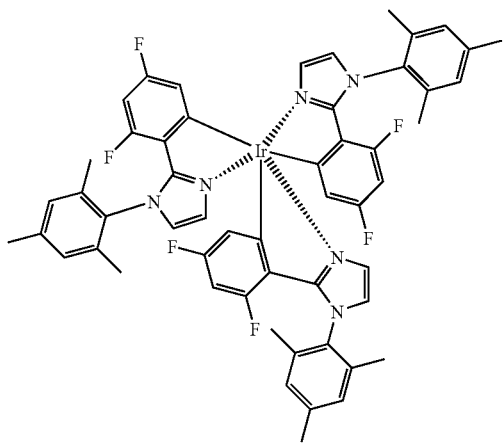
1-86
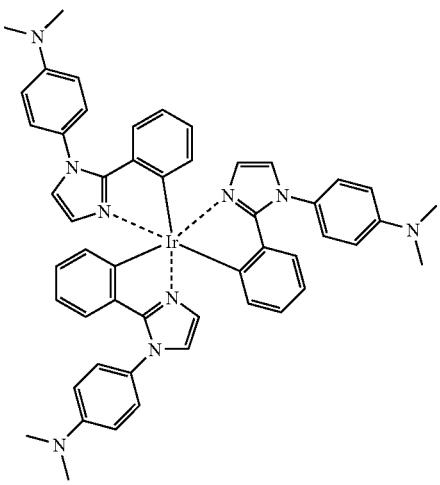
1-87
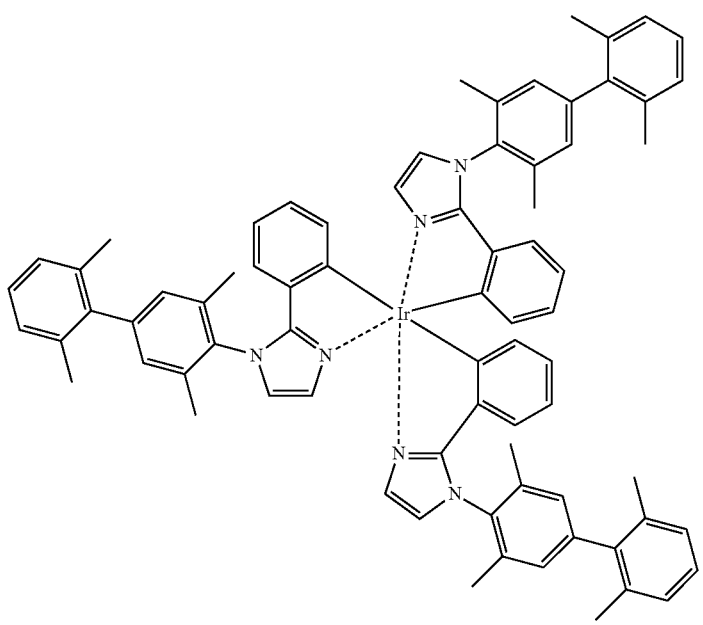
1-88
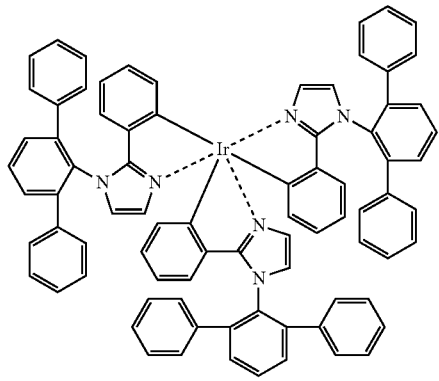
1-89
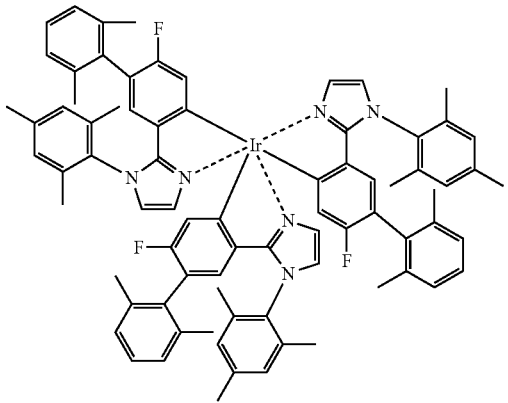

1-90
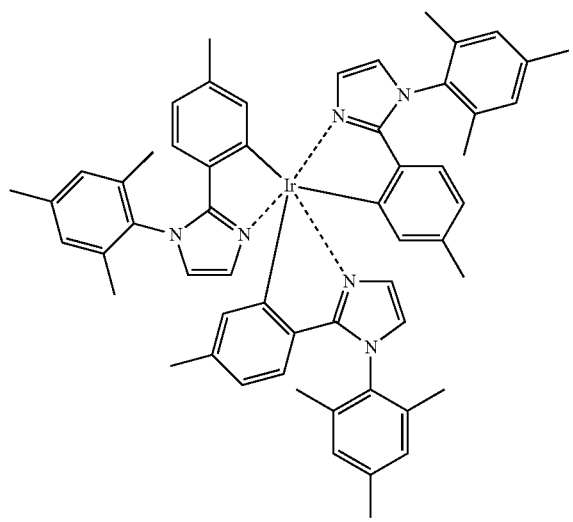
1-91
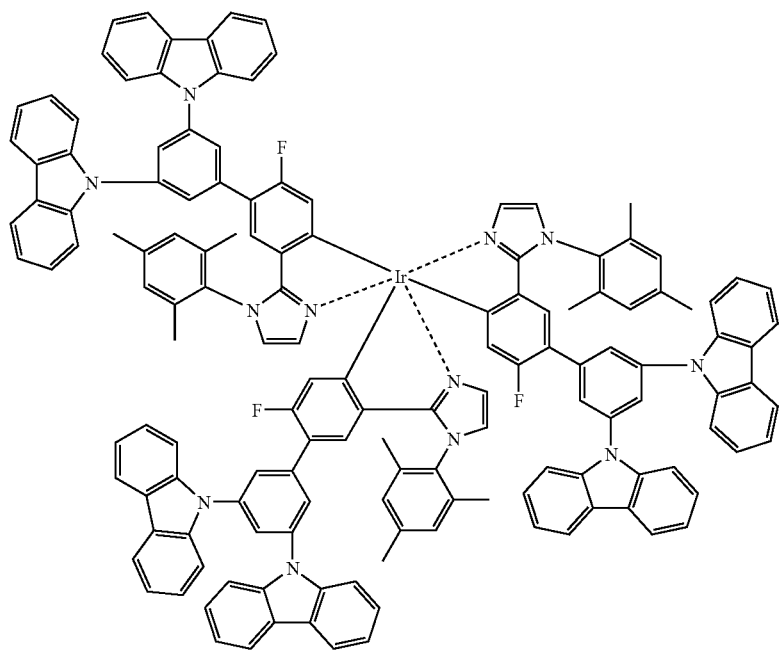

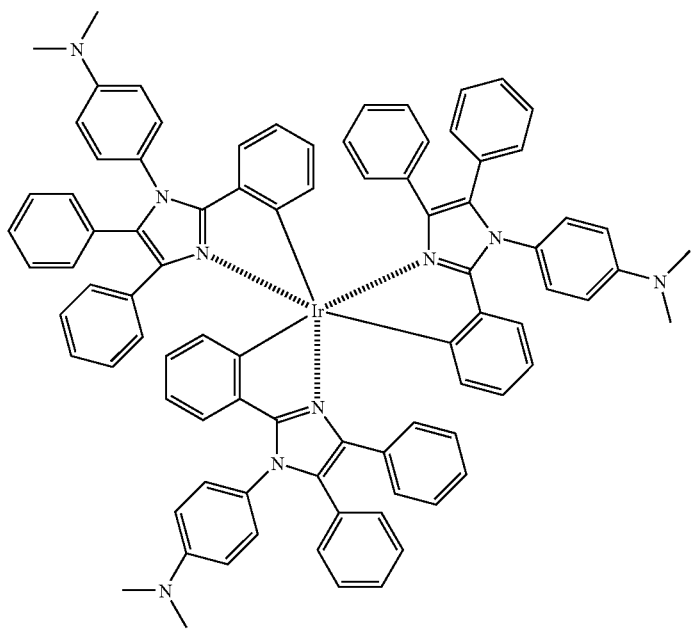
1-92
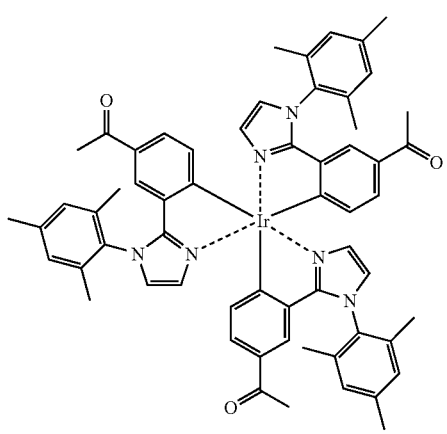
1-93
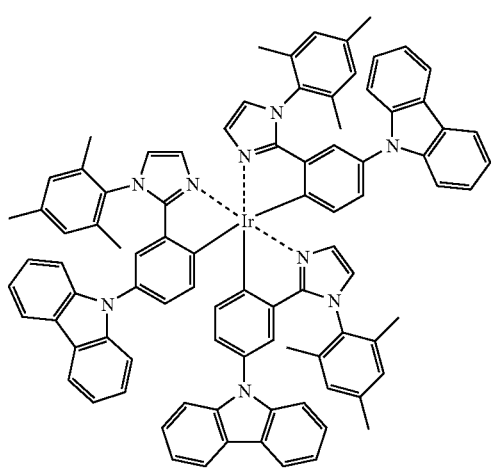
1-94
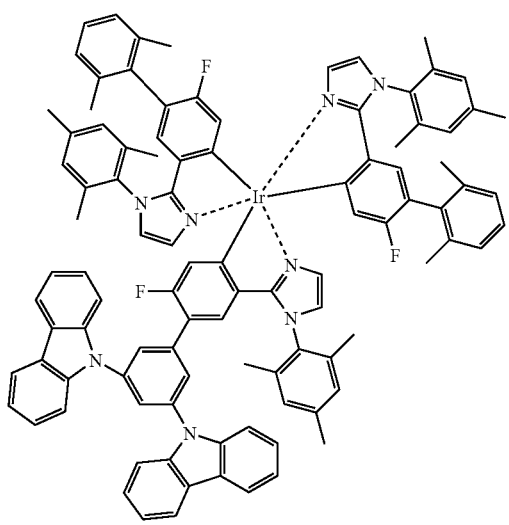
1-95
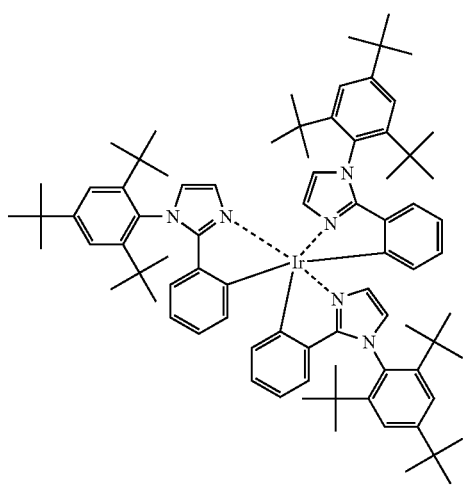
1-96

-continued
1-97
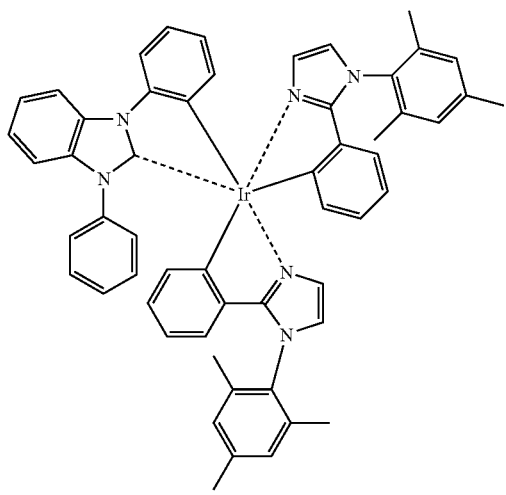
1-98
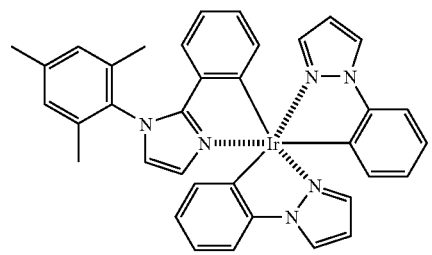
1-99
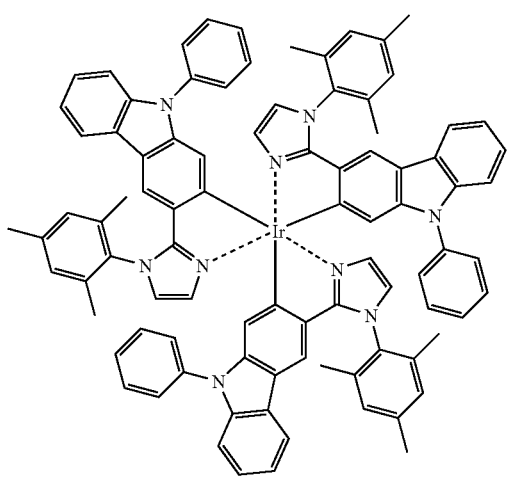
1-100
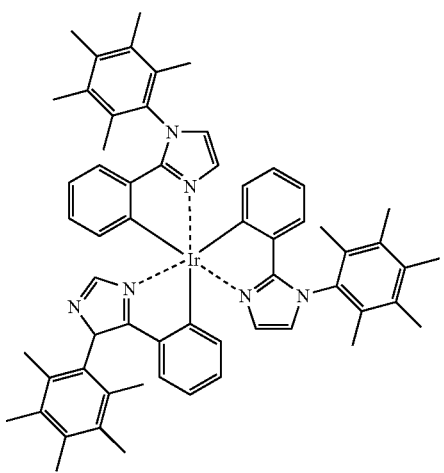
1-101
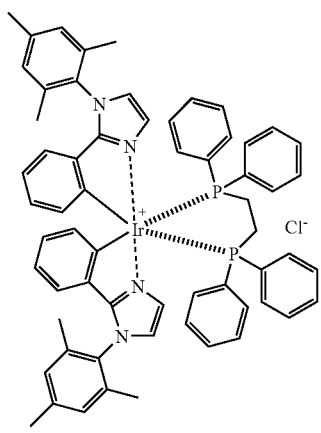
1-102
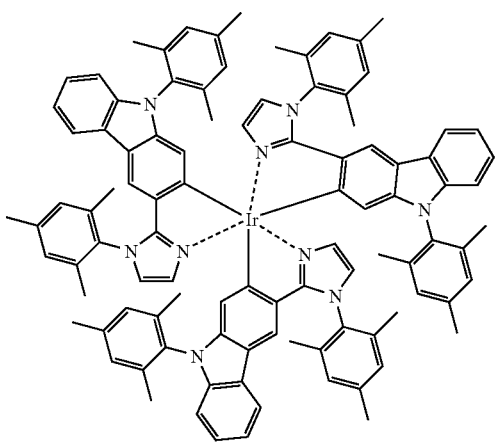

-continued
1-103
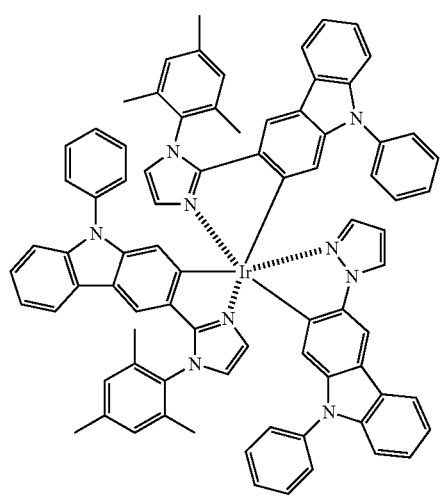
1-104
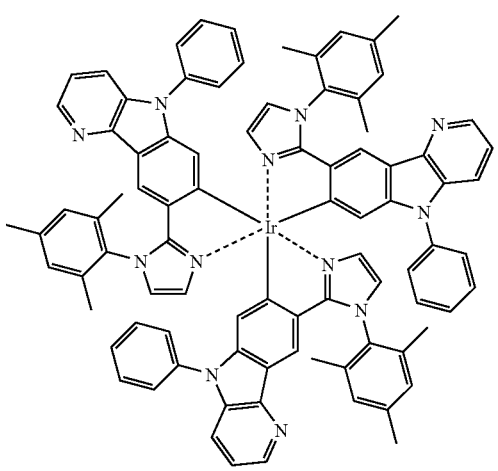
1-105
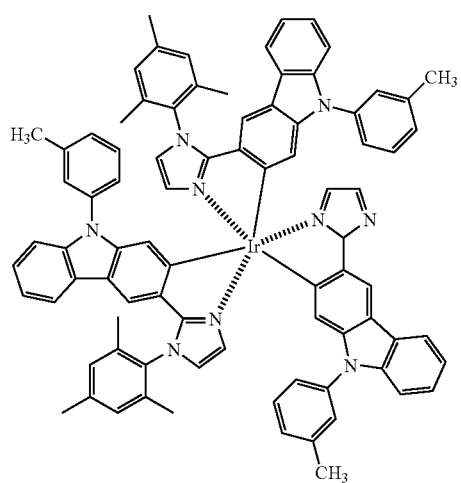
1-106
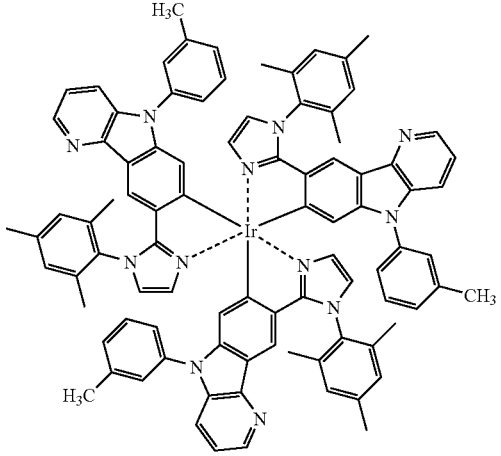
1-107
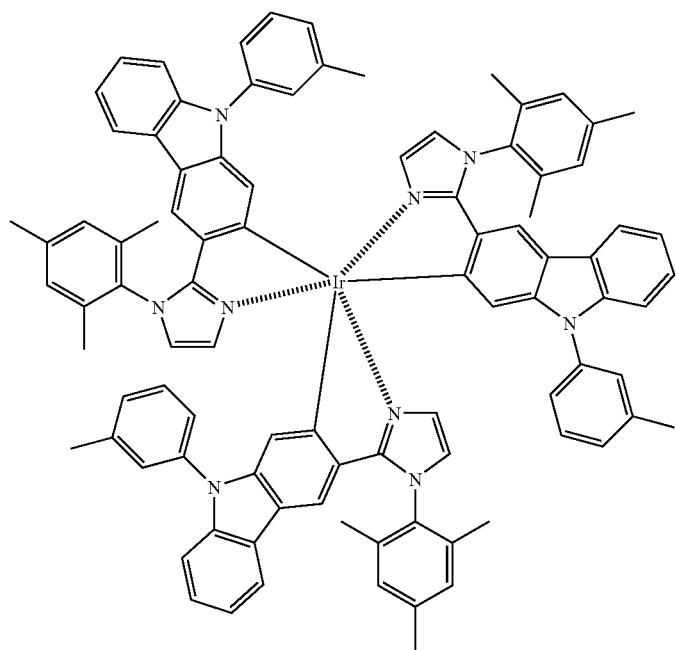

It is possible to synthesize these metal complexes, employing the methods described, for example, in Organic Letter, Vol. 3, No. 16, pages 2,579-2,581, Inorganic Chemistry, Volume 30, No. 8, pages 1,685-1,687 (1991), J. Am. Chem. Soc., Volume 123, pages 4,304 (2001), Inorganic Chemistry, Volume 40, No. 7, pages 1,704-1,711 (2001), Inorganic Chemistry, Volume 41, No. 12, pages 3,055-3,066 (2002), New Journal of Chemistry, Volume 26, page 1,171 (2002), and European Journal of Organic Chemistry, Volume 4, pages 695-709 (2004), as well as the methods described in the references cited in the above literatures.

(Fluorescent Compound: Fluorescent Light Emitting Material)

A typical example of the fluorescent compound, referred as also a fluorescent light emitting material or a fluorescent dopant, includes coumarin type dye, pyran type dye, cyanine type dye, croconium type dye, squarylium type dye, oxobenzanthracene type dye, fluorescein type dye, rhodamine type dye, pyrilium type dye, perylene type dye, stilbene type dye, polythiophene type dye or rare earth complex type fluorescent materials.

Conventional dopants may also be employed, examples thereof are listed;
WO 00/70655, JP-A2002-280178, 2001-181616, 2002-280179, 2001-181617, 2002-280180, 2001-247859, 2002-299060, 2001-313178, 2002-302671, 2001-345183, 2002-324679, WO 02/15645, JP-A2002-332291, 2002-50484, 2002-332292, 2002-83684, 2002-540572, 2002-117978, 2002-338588, 2002-170684, 2002-352960, WO 01/93642, JP-A2002-50483, 2002-100476, 2002-173674, 2002-359082, 2002-175884, 2002-363552, 2002-184582, 2003-7469, 2002-525808, 2003-7471, 2002-525833, 2003-31366, 2002-226495, 2002-234894, 2002-235076, 2002-241751, 2001-319779, 2001-319780, 2002-62824, 2002-100474, 2002-203679, 2002-343572, 2002-203678 and so on.

<<Positive Hole Transporting Layer>>

The positive hole transporting layer, as described herein, is composed of positive hole transporting materials which exhibit the function of transporting positive holes, and in a broad sense, includes a positive hole injecting layer and an electron blocking layer. The positive hole transporting layer may be composed of a single layer or a plurality of layers.

Positive hole transporting materials are those which exhibit either the injection or transportation of positive holes, or the blocking of electrons, and may be either organic or inorganic compounds. Examples thereof include triazole derivatives, oxazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, and aniline based copolymers, as well as electrically conductive macromolecular oligomers, especially thiophene oligomers.

It is possible to employ, as positive hole transporting materials, the above materials. In addition, it is preferable to employ porphyrin compounds, aromatic tertiary amine compounds, and styrylamine compounds. Of these, it is particularly preferred to employ the aromatic tertiary amine compounds.

Representative examples of the aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, and N-phenylcarbazole. Further listed are compounds having two condensed aromatic rings in the molecule such as 4,4'-bis[N-(1-naphthyl)-N-phenylamino]biphenyl (NPD), described in U.S. Pat. Nos. 5,061,569 and 4,4',4''-tris[N-(3-methylphenyl)-N-phenylamino]triphenylamine (MTDATA) in which three triphenylamine units are linked in a starburst type, described in JP-A H04-308688.

Polymer materials, in which the material mentioned above is introduced in the polymer chain or incorporated as a main chain, can be also employed. Further inorganic materials such as p-type Si and p-type SiC can be used as a positive hole injection material or positive hole transport material. A so-called p-type hole blocking layer as disclosed in JP-A H11-251067 or described in the literature of J. Huang et al. (Applied Physics Letters 80 (2002), p. 139) is also applicable. In the present invention, these materials are preferably utilized since an emitting element exhibiting a higher efficiency is obtained.

It is possible to form a positive hole transporting layer in such a manner that the above positive hole transporting materials are subjected to thin film formation employing the methods, known in the art, such as a vacuum deposition method, a spin coating method, a casting method, a printing method including an ink-jet method, or an LB method. The thickness of the positive hole transporting layer is not particularly limited. The above thickness is commonly 5 nm to 5 μm, but is preferably 5 to 200 nm.

The above positive hole transporting layer may be in a single layer structure composed of at least one type of the above materials. Further, it is possible to employ electron transporting materials which are thought to exhibit properties of n type semiconductors doped with impurities. Examples thereof include those described in JP-A H04-297076, JP-A 2000-196140, and JP-A 2001-102175, as well as J. Appl. Phys., 95, 5773 (2004). In the present invention, it is preferable to employ such electron transporting materials which are thought to exhibit properties of n type semiconductors, since it is thereby possible to prepare an element which consumes less power.

<<Electron Transporting Layer>>

The electron transporting layer is composed of materials which exhibit a function to transport electrons, and includes, in a broad sense, an electron ejecting layer and a positive hole blocking layer. The electron transporting layer may be composed of a single layer or a plurality of layers. Heretofore, in the case of a single electron transporting layer or a plurality of them, electron transport materials (which also work as positive hole blocking materials), which are employed in the electron transporting layer adjacent to the cathode electrode side with respect to the light emitting layer, have been applicable when they exhibit a function to transfer electrons injected from the cathode to the light emitting layer. As such materials, it is possible to employ any of those selected from the compounds known in the art. Examples thereof include nitro-substituted fluorene derivatives, diphenylquinone derivatives, thiopyran dioxide derivatives, carbodiimide, fluorenylydenemethane derivatives, anthraquinodimethane and anthrone derivatives, as well as oxadiazole derivatives.

Further employed as electron transporting materials may be thiadiazole derivatives, which are prepared by replacing the oxygen atom of the oxadiazole ring in the above oxadiazole derivatives with a sulfur atom, as well as quinoxaline derivatives known as an electron attractive group. Further, it is also possible to employ polymer materials which are prepared by introducing any of the above materials into the polymer chain or in which any of the above materials are employed as the main chain of the polymer.

Further employed as the electron transporting materials may be metal complexes of 8-quinolinol derivatives such as tris(8-quinolinol)aluminum (ALq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, or bis(8-quinolinol)zinc (Znq), or metal complexes in which the central metal atom of these metal complexes is replaced with In, Mg, Cu, Ca, Sn, Ga, or Pb.

Other than these, preferably employed as the electron transporting materials may be metal free or metal phthalocyanines, or compounds in which the end of the above phthalocyanine is substituted with an alkyl group or a sulfonic acid group. Further employed as electron transporting materials may be distyrylpyrazine derivatives. Still further employed as electron transporting materials may be inorganic semiconductors such as n type-Si or n type-SiC in the same manner as in the positive hole injecting layer and positive hole transporting layer.

It is possible to form the electron transporting layer in such a manner that the above electron transporting materials are modified to be a thin film via methods known in the art such as a vacuum deposition method, a spin coating method, a casting method, a printing method including an ink-jet method, or an LB method. The thickness of the electron transporting layer is not particularly limited, and is commonly about 5 nm-about 5 μm, but is preferably 5-200 nm.

The electron transporting layer may be in a single layer structure composed of at least one of the above materials. Further, it is possible to employ electron transporting materials which are thought to exhibit properties of n type semiconductors doped with impurities. Examples thereof include those described in JP-A H04-297076, H10-270172, 2000-196140, and 2001-102175, as well as J. Appl. Phys., 95, 5773 (2004). In the present invention, it is preferable to employ such electron transporting materials which are thought to exhibit properties of n type semiconductors, since it is thereby possible to prepare an element which consumes less power.

<Injection Layer: Electron Injection Layer, Positive Hole Injection Layer>

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An injection layer is appropriately provided and includes an electron injection layer and a positive hole injection layer, which may be arranged between an anode and an emitting layer or a positive transfer layer, and between a cathode and an emitting layer or an electron transport layer, as described above.

An anode buffer layer (a positive hole injection layer) is also detailed in such as JP-A H09-45479, H09-260062 and H08-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polyaniline (emeraldine) and polythiophene.

A cathode buffer layer (an electron injection layer) is also detailed in such as JP-A H06-325871, H09-17574 and H10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm to 5 μm although it depends on a raw material.

<Inhibition Layer: Positive Hole Inhibition Layer, Electron Inhibition Layer>

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. The constitution of the electron transport layer described above can be used as the positive hole inhibition layer of this invention if necessary. The positive hole inhibition layer of the organic EL element of the present invention is preferably arranged adjacent to the light emitting layer.

An inhibition layer is appropriately provided in addition to the basic constitution layers composed of organic thin layers as described above. Examples are described in such as JP-A H11-204258 and H11-204359 and p. 273 of "Organic EL Elements and Industrialization Front Thereof (Nov. 30 (1998), published by N. T. S Corp.)" is applicable to a positive hole inhibition (hole block) layer according to the present invention.

Further, at least 50% by weight of the compounds incorporated in the positive hole inhibition layer preferably exhibits the ionization potential which is greater by at least 0.2 eV than that of the host compounds of the aforesaid shortest wavelength light emitting layer. The positive hole inhibition layer according to this invention preferably contains the electron donor described above to increase electron density for lower driving potential.

The ionization potential is defined as energy which is necessary to release electrons in the HOMO (Highest Occupied Molecular Orbital) to the vacuum level, and may be determined via, for example, the method described below.

(1) By employing Gaussian 98 (Gaussian 98, Revision A. 11. 4, M. J. Frisch, et al. Gaussian 98 (Gaussian 98, Revision A. 11. 4, M. J. Frisch, et al, Gaussian, Inc., Pittsburgh Pa., 2002), which is a molecular orbital calculation software, produced by Gaussian Co. in the United State of America, and by employing B3LYP/6-31G* as a key word, the value (in terms of corresponding eV unit) was computed, and it is possible to obtain the ionization potential by rouging off the second decimal point. The background, in which the resulting calculated values are effective, is that the calculated values obtained by the above method exhibit high relationship with the experimental values.

(2) It is possible to determine the ionization potential via a method in which ionization potential is directly determined employing a photoelectron spectrometry. For example, by employing a low energy electron spectrophotometer "Model AC-1", produced by Riken Keiki Co., Ltd., or appropriately employ a method known as an ultraviolet light electron spectrometry.

On the other hand, the electron inhibition layer, as described herein, has a function of the positive hole transport layer in a broad sense, and is composed of materials having markedly small capability of electron transport, while having capability of transporting positive holes and enables to enhance the recombination probability of electrons and positive holes by inhibiting electrons, while transporting electrons. Further effect of lowering potential can be obtained by containing above mentioned electron acceptor.

The thickness of the positive hole inhibition layer and the electron transport layer according to the present invention is preferably 3 to 100 nm, but is more preferably 5 to 30 nm.

<<Substrates>>

Types of substrates (hereinafter also referred to as bases, base boards, base materials, or supports) are not particularly limited to glass and plastic, and may further be transparent or opaque. When light passing through a substrate is utilized, the substrate is preferably transparent. It is possible to list, as preferably employed transparent substrates, glass, quartz, or a transparent resin film. Of these, the particularly preferred substrate is a resin film capable of resulting in flexibility of the organic EL elements.

Examples of materials of such a resin film include polyester such as polyethylene terephthalate (PET), or polyethylene naphthalate (PEN), polyethylene, polypropylene, cellulose esters or derivatives thereof such as cellophane, cellulose diacetate, cellulose triacetate, cellulose acetate butyrate, cellulose acetate propionate (CAP), cellulose acetate phthalate (TAC), or cellulose nitrate, polyvinylidene chloride, polyvinyl alcohol, polyethylene vinyl alcohol, syndiotactic polystyrene, polycarbonate, norbomane resins, polymethylpentane, polyether ketone, polyimide, polyether sulfone (PES), polyphenylene sulfide, polysulfones, polyetherimide, polyetherketoneimide, polyamide, fluororesins, nylon, polymethyl methacrylate, acryl or polyacrylates, and cycloolefin based resins such as ARTON (a registered trade, produced by JSR Co.) or APERU (a registered trade name, produced by Mitsui Chemical Co., Ltd.).

A film of inorganic or organic compounds or a hybrid film of both of them may be formed on the surface of the resin film. The above film is preferably a barrier film of a water vapor permeability of at most $1\times10^{-3}$ g/(m$^2$·24 hours) (at 25±0.5° C. and relative humidity 90±2%), which is determined based on the method of JIS K 7129 1992. Further, the above film is preferably a high barrier film of an oxygen permeability of at most $1\times10^{-3}$ ml/m$^2$·24 hours determined based on the method of JIS K 7126 1987 and a water vapor permeability of $1\times10^{-3}$ g/(m$^2$·24 hours) (25±0.5° C. and relative humidity 90±2%).

As a material to form the barrier film, employed may be those which exhibit a function to retard the penetration of materials such as moisture or oxygen which degrade elements, and it is possible to employ, for example, silicon oxide, silicon dioxide, or silicon nitride. It is preferable to form a plural layer structure composed of an inorganic layer and a layer incorporating organic materials in order to decrease brittleness. The layer forming order of the inorganic and organic layers is not particularly limited. It is preferable that both are alternately laminated several times.

<<Barrier Film Forming Method>>

Preparation methods of the barrier film are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, particularly preferred is the atmospheric pressure plasma polymerization method, as described in JP-A 2004-68143. Examples of opaque substrates include metal plates or films composed of aluminum or stainless steel, opaque resin substrates, and substrates composed of ceramic materials.

Taking out efficiency of emission light of the organic EL panel of this invention is preferably 1% or more at room temperature, and more preferably 5% or more. Herein, taking out quantum efficiency (%)=photon number emitted out of organic EL element/electron number supplied to organic EL element×100. Further, a hue improving filter such as a color filter, or color conversion filter which convert the emission light from the organic EL panel to multicolor by employing phosphor material, may be utilized in combination.

<<Sealing>>

It is possible to list, as a sealing means employed to seal the organic EL element of the present invention, for example, a method which allows a sealing member to adhere to the electrodes and a substrate employing adhesives. The sealing member may be arranged to cover the display region of the organic EL element, and may be either in the form of an intaglio plate or a flat plate. Transparency and electric insulation are not particularly limited.

Specifically listed are glass plates, polymer plate/film, and metal plate/film Glass plates may include specifically soda-lime glass, barium and strontium containing glass, lead glass, aluminosilicic acid glass, borosilicic acid glass, barium borosilicic acid glass, and quartz.

Further, listed as the polymer plates may be those composed of polycarbonate, acryl, polyethylene terephthalate, polyether sulfide, and polysulfone. Listed as the metal plates may be those composed of at least one metal selected from the group consisting of stainless steel, iron, copper, aluminum, magnesium, nickel, zinc, chromium, titanium, molybdenum, silicon, germanium and tantalum, or an alloy composed of at least two metals selected from the above group.

In the present invention, it is possible to preferably employ polymer and metal films since it is possible to make the panel thinner. It is preferable that the polymer film is a barring property film of a water vapor permeability of at most $1\times10^{-3}$ g/(m$^2$·24 hours) (at 25±0.5° C. and relative humidity 90±2%) which is determined by the method in accordance with JIS K 7129 1992. It is more preferable that the polymer film is a higher barring property film of an oxygen permeability of at most $1\times10^{-3}$ ml/m$^2$·24 hours atmosphere, and a water vapor permeability of $1\times10^{-3}$ g/(m$^2$·24 hours) which is determined by the method in accordance with JIS K 7126 1987.

In order to achieve intaglio surface of a sealing member, employed may be sand blasting or chemical etching.

It is possible to specifically list, as an adhesive, photocurable and thermocurable type adhesives having a reactive vinyl group of acrylic acid based oligomers and methacrylic acid based oligomer, and moisture curable type adhesives such as 2-cyanoacrylic acid ester. Further, it is possible to list a thermal and chemical curing type (two liquids blending). Still further, it is possible to list hot-melt type polyamide, polyester, and polyolefin. Still further, it is possible to list cationically curable type ultraviolet ray curable type epoxy resin adhesives.

Since organic EL elements are occasionally degraded due to a thermal treatment, preferred are those which are adhesion-curable from room temperature to 80° C. Further, desiccants may be dispersed into the above adhesives. Application of adhesives onto the sealing portion may be achieved by a commercial dispenser or printed in the same manner as screen printing.

Further, inorganic and organic material layers are formed in such a configuration that in the outside of an electrode on the side which interposes an organic layer and faces a substrate, the aforesaid electrode and organic layer are covered in the form of contact with the substrate. The above inorganic and organic layer is preferably employed as the sealing film. In this case, any of the materials may be applied to the aforesaid film as long as they exhibit a function to retard penetration of materials, such as moisture or oxygen, which result in degradation of the element. Usable examples thereof include silicon oxide, silicon dioxide, and silicon nitride. Further, in order to improve fragility of the aforesaid film, it is preferable that a laminated layer structure is realized employing these inorganic layers and layers composed of organic materials.

Forming methods of these films are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure polymerization method, a plasma CVD method, a laser CVD method, a thermal CVD method, or a coating method.

It is preferable that in a gas and liquid phase, inert gases such as nitrogen or argon and chemically stable liquid such as fluorinated hydrocarbon or silicone oil are injected into the space between the sealing member and the display area of the organic EL element. Further, it is possible to form a vacuum. Still further, it is possible to enclose hygroscopic compounds inside.

Examples of hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). Of sulfates, metal halides, and perchlorates, anhydrous salts are suitably employed.

<<Protective Film and Protective Plate>>

In order to enhance mechanical strength of the element, a protective film or a protective plate may be provided on the exterior side of the above sealing film on the side facing a substrate, while interposing an organic layer or the above sealing film. Specifically, when sealing is conducted via the above sealing film, the resulting strength is not always sufficient. Consequently, it is preferable to provide the above protective film or protective plate.

It is possible to employ, as usable materials for the above, glass plates, polymer plate/film, and metal plate/film which are the same as those employed for the above sealing. In view of light weight and thin film formation, it is preferable to employ polymer films <<Anode>>

As an anode in the organic EL element, preferably employed are those which employ, as electrode materials, metals, alloys, electrically conductive compounds, and mixtures thereof, which exhibit a relatively high work function at least 4 eV Specific examples of such electrode materials include metals such as Au, and electrically conductive transparent materials such as CuI, indium tin oxide (ITO), $SnO_2$, or ZnO. Further employed may be IDIXO ($In_2O_3$—ZNO) which enables formation of an amorphous, transparent, and electrically conductive film The anode may be formed in such a manner that a thin film is formed via methods such as vapor deposition or sputtering, employing these electrode materials, and the desired shaped pattern is formed via a photolithographic method. Further, when pattern accuracy is not strictly required, for example, at least about 100 μm, a pattern may be formed via the desired shaped mask during vapor deposition or sputtering of the above electrode materials. Alternately, when materials such as organic electrically conductive compounds, capable of being coated, are employed, it is possible to employ wet system film making methods such as a printing system or a coating system. When light is emitted from the above anode, it is desirable that transmittance is at least 10%, and it is preferable that sheet resistance as the anode is at most a few hundred Ω/□. Further, the selected film thickness, depending on materials, is commonly in the range of 10 to 1,000 nm, but is preferably in the range of 10 to 200 nm.

<<Cathode>>

On the other hand, as a cathode preferably employed are those which employ, as electrode materials, metal called electron injecting metals, alloys, electrically conductive compounds, and mixtures thereof, which exhibit a relatively low work function at most 4 eV.

Specific examples of such electrode materials include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and rare earth metals.

Of these, in view of electron injection capability and resistance to oxidation, suitable are mixtures of an electron injecting metal and a second metal which is stable and exhibits a higher work function than that of the above metal, such as a magnesium/silver mixture, a magnesium/aluminum mixture, a magnesium/indium mixture, an aluminum/aluminum oxide ($Al_2O_3$) mixture, a lithium/aluminum mixture, or aluminum.

It is possible to prepare the cathode via formation of a thin film of the above electrode materials, employing methods such as vapor deposition or sputtering. It is preferable that sheet resistance as the cathode is at most a few hundred Ω/□. Further, the film thickness is commonly selected to be in the range of 10 nm to 5 μm, but is preferably selected to be in the range of 10 to 200 nm. In order to transmit the emitted light, it is advantageous that either the anode or the cathode is transparent or translucent to enhance luminance of the emitted light.

Further, it is possible to prepare a transparent or translucent cathode in such a manner that after preparing the above metal film, of a thickness of 1 to 20 nm, on the cathode, electrically conductive transparent materials, listed in the description of the anode, are applied onto the above film. By applying the above, it is possible to prepare an element in which both the anode and the cathode exhibit transparency.

<<Light Taking-Out Sheet and/or Light Collector Sheet>>

Though it is generally desirable to have a property emitting omnidirection so as not to change brightness even viewing angle changes in an organic electroluminescent panel used for a backlight, particularly, it is, however, desirable to have higher brightness at front brightness and lower brightness at high angular field of view (angle to observe in oblique direction) depending usage style. Therefore, it is preferable to use a diffuser panel or a prism sheet to control emitting angle on the organic electroluminescent panel in combination.

A part of light emitted from the emitting layer generally causes total reflection at the interface between substrate and air, and a problem of loss of light occurs, in the organic electroluminescent panel in which emits light from the substrate such as a glass substrate, and a resin substrate. Efficiency of light taking out is improved by inhibiting total reflection in such a manner to process the surface of the substrate in prism or lens shape or adhering a prism sheet or lens sheet on the surface of the substrate to dissolve this problem.

Preferable embodiments of the light taking-out sheet and light collector sheet are described below. Efficiency of light taking out can be improved by employing these as far as the object and effect of this invention are not damaged.

(1) Arrangement Placing Diffusion Panel and Prism Sheet on Glass Substrate

The first diffusion panel is placed in contact with the substrate surface opposite to the emitting layer with respect to glass substrate, for example, in the organic electroluminescent panel composed of arrangement of glass substrate/transparent electroconductive layer/organic emitting layer/electrode/sealing layer. The first lens sheet, such as BEF II, manufactured by 3M Company, is placed in contact with the diffusion plate so that a lens surface side is faced to a side opposite to the glass substrate, and the second lens sheet is placed so that lens stripes are orthogonal to the first lens stripes as well as the lens surface side is faced to a side opposite to the glass substrate.

The second diffusion plate is placed so as to contact with the second lens sheet. Shape of the first and the second lens sheet is one having a stripe of triangles are formed on a PET substrate, which stripe exhibits an apex angle of 90 degrees and a pitch of 50 μm. It may be a shape such as a rounded apex (R BEF II, manufactured by 3M Company), randomly varying pitches (BEF III, manufactured by 3M Company), and the like.

The first diffusion plate, having a bead containing layer reflecting light formed on PET substrate of approximately 100 μm thickness, has a transmittance of approximately 85% and haze of approximately 75%. The second diffusion plate, having a bead containing layer reflecting light formed on PET substrate of approximately 100 μm thickness, has a transmittance of approximately 95% and haze of approximately 30%. The diffusion panel placed in contact with the glass substrate may be adhered to the glass substrate through an optical adhesive.

Alternatively, a glass substrate having a light diffusing layer coated directly thereon, or a glass substrate on which minute structure to diffuse light is provided thereon, may be used. The substrate may be resin substrate though a glass is used as an example in the above description.

(2) Arrangement Forming Micro-Lens Array on Glass Substrate

A micro-lens array sheet is adhered to the glass substrate opposite to a side provided with emitting layer by employing an optical adhesive, in the organic electroluminescent panel composed of arrangement of glass substrate/transparent electroconductive layer/organic emitting layer/electrode/sealing layer. The micro-lens array sheet has a shape in which micro-lens of quadrangular pyramid of 50 μm exhibiting an apex angle of 90 degrees is arrayed with a pitch of 50 μm.

The micro-lens sheet can be manufactured by a method in which UV hardenable resin is put into a space between metal mould of the micro-lens array and glass plate provided through 0.5 mm spacer, UV ray is exposed from the glass plate so as to harden the resin and the micro-lens sheet is obtained. Shapes of the micro-lens may be conical pyramid, triangular pyramid, or convex lens. Though the micro-lens sheet is adhered to glass substrate as an example described above, it may be adhered to resin substrate. Another layer arrangement may be available in which transparent electrode/organic emitting layer/electrode/sealing layer is provided on the micro-lens sheet of the opposite surface to the side on which micro-lens array is provided.

(3) Arrangement Adhering Micro-Lens Array Down Ward on Surface of Substrate

Micro-lens sheet is adhered to the glass substrate at an opposite side to a side on which the organic emitting layer is provide so that the concave-convex side of the micro-lens faces to the glass substrate through an optical adhesive in the organic electroluminescent device having a layer arrangement of glass substrate/transparent electroconductive layer/organic emitting layer/electrode/sealing layer.

The micro-lens array sheet has a shape in which micro-lens of quadrangular pyramid of 50 μm whose apex is made flat is arrayed with a pitch of 50 μm. The flat surface is adhered to the glass substrate. Shapes of respective micro-lens may be conical pyramid, triangular pyramid, or convex lens. Though the micro-lens sheet is adhered to glass substrate as an example described above, it may be adhered to resin substrate.

It is preferable to provide a low refractive index layer between the transparent electrode and transparent substrate. When a low refractive index medium of a thickness, which is greater than the wavelength of light, is formed between the transparent electrode and the transparent substrate, the extraction efficiency of light emitted from the transparent electrode to the exterior increases as the refractive index of the medium decreases. As materials of the low refractive index layer, listed are, for example, aerogel, porous silica, magnesium fluoride, and fluorine based polymers.

Since the refractive index of the transparent substrate is commonly about 1.5 to about 1.7, the refractive index of the low refractive index layer is preferably at most approximately 1.5, but is more preferably at most 1.35. Further, thickness of the low refractive index medium is preferably at least two times the wavelength in the medium. The reason is that when the thickness of the low refractive index medium reaches nearly the wavelength of light so that electromagnetic waves oozed via evanescent enter into the substrate, effects of the low refractive index layer are lowered.

Examples of the low refractive index layer will be described below. This invention is not restricted to these as far as the object and effect are not damaged.

(1) Method Dispersing Hollow Silica

A method is described in which the low refractive index layer is formed on the glass substrate by dispersing hollow silica by means of sol-gel method.

The low refractive index layer can be formed on the glass substrate by the following steps. Liquid composed of low refractive index material (silica particles, refractive index of 1.35, manufactured by Catalysts and Chemicals Ltd.) to which isopropyl alcohol is added is mixed with composition liquid of metal alkoxide (tetraethyl orthosilicate $Si(OC_2H_5)_4$) as a raw material, ethanol as a solvent, acetic acid as a catalyser and water required for hydrolysis, they were subjected to hydrolysis and polycondensation reaction to keep several ten ° C., and produce liquid sol.

The obtained sol is coated on a glass substrate by means of spin coating and is solidified through reaction. It was dried at ° C. atmosphere to obtain dry gel, and composition of the liquid and condition of spin coating are controlled so as to form the thickness of 0.5 μm.

A low refractive index layer having a thickness of 0.5 μm and a refractive index of 1.37 is formed as the result. Though spin coating is described above as an example of coating method, other method to obtain uniform thickness such as dip coat is available. Though glass substrate is illustrated as an example, it is possible to coat on the resin substrate directly since process temperature is not higher than 150° C. Further effect is expected making the refractive index of the low refractive index layer of 1.37 or less, by selecting raw material or low refractive index material to give lower refractive index. Thickness of the layer is preferably 0.5 μm or more, and more preferably 1 μm or more.

Manufacturing method of the hollow silica is described in, for example, JP-A 2001-167637, 2001-233611, 2002-79616 and so on.

(2) Silica Aerogel

The transparent low refractive index layer is formed by silica aerogel obtained by ultra-critical drying of wet gel formed by sol-gel reaction of silicon alkoxide. The silica aerogel is light transmitting porous material having uniform ultra-micro structure.

Liquid A is prepared by mixing tetramethoxy silane oligomer with methanol. Liquid B is prepared by mixing water, aqueous ammonia and methanol. Aqueous solution of alkoxy silane obtained by mixing Liquid A and Liquid B is coated on a substrate. Alkoxy silane made gel state is subjected to aging in aging solution composed of water, aqueous ammonia and methanol over one day and one night. Gel state in a film form compound obtained by aging is subjected to hydrophobilizing treatment in isopropanol solution of hexamethyl silazane. Silica aerogel is formed by ultra critical drying.

(3) Porous Silica

Solution of low dielectric constant containing water repelling hexamethyl disiloxane or hexamethyl disilazane is coated on a substrate to form a layer. The solution of low dielectric constant used here may be incorporated an additive such as alcohol or butyl acetate if necessary further to water repelling substance such as hexamethyl disiloxane or hexamethyl disilazane. A low refractive index layer is obtained by evaporating solvent, acid or alkali catalyser, surfactant and so on in the above described low dielectric material via burning process or so.

A substrate having a transparent electrode is prepared by forming a low refractive index layer on the substrate then an ITO layer is formed via DC sputtering method directly on the low refractive index layer or via an intermediate layer of transparent insulating layer of SiO2 formed via RF sputtering method or so.

It is preferable to combine a method in which the interface which results in total reflection or a diffraction grating is introduced in any of the media is characterized in that light extraction efficiency is significantly enhanced, as disclosed in JP-A H11-283751 or 2001-236748.

The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced. However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous. In this case, the cycle of the diffraction grating is preferably about ½ to about 3 times the wavelength of light in the medium. The preferable arrangement of the diffraction grating is such that the arrangement is two-dimensionally repeated in the form of a square lattice, a triangular lattice, or a honeycomb lattice.

Forming method of a diffraction grating on a glass substrate is as follows. Positive type resist is applied on the glass substrate surface after glass is washed. Then coherent two parallel light beams having wave length of $\lambda$ are exposed on the resist so that the beams are opposing to each other with an angle of $\theta$ with respect to perpendicular direction of the substrate. An interference pattern with pitch of d is formed on the resist.

Herein $d=\lambda/(2 \cos \theta)$.

A first interference pattern having photonic crystal of pitch of 300 nm is formed by exposing in a direction of angle of 35.6° with respect to perpendicular direction of the substrate employing argon laser with wave length of 488 nm. Then a second interference pattern is formed by rotating the substrate with 90° within the substrate plane so that the second interference pattern is orthogonal to the first interference pattern. The second interference pattern is formed with 300 nm pitch by maintaining the exposure beam without change.

Two interference patterns are exposed in superposing on the resist and exposure pattern in lattice form is formed. Development is conducted so that the resist is removed only at a portion strongly exposed by two superposed interference patters by selecting exposure power and developing condition. A pattern in which resist is removed in a circular shape at a portion where two interference patterns having a pitch of 300 nm is superposed, is formed on the glass substrate. Diameter of the circle is, for example, 220 nm.

Holes each having depth of 200 nm are formed at portions where resist is removed by dry etching. Then resist is removed and the glass substrate is washed. A glass substrate having holes with depth of 200 nm and diameter of 220 nm, arranged on apices of a square lattice with a pitch of 300 nm are formed by such a manner.

Then ITO layer having thickness of around 300 nm measured from the bottom of holes are formed via bias sputtering, wherein surface is made flat within 50 nm roughness by controlling bias sputtering condition.

The glass substrate having ITO thus obtained is subjected to surface abrasion whereby the glass substrate having ITO for the organic EL is prepared.

Further to a method in which patterning is conducted by coating photoresist on the glass substrate and then subjecting to etching, the other methods are applicable, for example, glass pattern is formed in the similar manner, a UV hardenable resist is transferred to the glass substrate surface via nanoimprint, and then glass substrate is subjected to etching. Furthermore, pattern formed on the glass substrate is transferred to metal mold via nickel plating method or so, and the metal mold is transferred to a resin via nanoimprint to form a substrate. The resin substrate is applicable to this invention.

The amplification factor of front brightness is enhanced in the EL panel employing the light taking-out sheet and/or light collector sheet. The light thus took out is adjusted to be white.

The emitted light is classified to blue light having 440 to 500 nm, green light having 600 to 640 nm and red light having 600 to 640 nm. Therefore, the peak of the front brightness of the organic electroluminescent panel without the light taking-out sheet and/or light collector sheet is blue color is qualitatively most small ratio in comparison with one having the sheet, though it varies depending to emitting material (substantially dopants) in this invention.

A longer life time is possible in organic electroluminescent panel when the light taking-out sheet and/or light collector sheet is employed since blue light is generally limiting factor of life time in continuous operation. Driving voltage is constrained by blue light in which energy gap between HOMO and LOMO is highest, the organic EL panel with improved light taking out is capable of design having small front brightness of blue light, and it makes possible to reduce driving voltage.

This means that longer life time can be obtained in comparison with one having no the light taking-out sheet and/or light collector sheet, since thickness of the blue light emitting layer can be made thinner and driving voltage can be reduced.

The magnification factor by the light taking-out sheet and/or light collector sheet can be determined as follows. Front emitting light brightness (front brightness at 2° view angle) is measured at the state of with and without of the light taking-out sheet and/or light collector sheet is measured in such a manner that an optical axis of a spectral radiance meter coincides with the normal line from emitting plane, by employing a spectral radiance meter (for example, CS-1000 manufactured by Konica Minolta Sensing Inc.) in necessary visible light wavelength region, and calculate the ratio of integrated value.

<<Emitting, Front Brightness, Chromaticity of Organic Electroluminescent Panel>>

Color of light emitted from the organic electroluminescent panel or the organic compound according to the invention is determined by measurement employing a spectral irradiation photometer CS-1000, manufactured by Konica Minolta Sensing Inc., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai.

White color referred in this invention is designated as one having color temperature of not less than 2,500 K and not more than 8,000 K, and Auv showing deviation between black body locus and day light locus is not less than −0.02 and not more than +0.02 on the USC chromaticity diagram (CIE 1976). Herein, Δuv is defined as follows.

$$\Delta uv = (\Delta u^{*2} + \Delta v^{*2})^{1/2},$$

wherein Δu* and Δv* are the deviations between black body locus and day light locus of u* and v* on dimensional coordinates of CIE 1976 (L*u*v*) color space, respectively.

The organic EL element includes the optical sheet when white light is emitted by employing the optical sheet in this invention.

<<Preparation Method of Organic EL Element>>

As one example of the preparation method of the organic EL element of the present invention, described is a preparation method of an organic EL element composed of an anode/positive hole injecting layer/positive hole transporting layer/light emitting layer/positive hole blocking layer/electron transporting layer/cathode.

Initially, an anode is prepared in such a manner that a thin film composed of desired electrode materials, such as anode materials, is formed to result in a film thickness of at most 1 μm, preferably 10 to 200 nm, employing vapor deposition or sputtering. Subsequently, formed on the above is a thin film of organic compounds composed of a positive hole injecting layer, a light emitting layer, a positive hole blocking layer, and an electron transporting layer.

Methods for forming the above organic compound thin film include, as described above, a vacuum deposition method and wet processes (such as a spin coating method, a cast method, an ink-jet method, a spray method or a printing method), and the thin film can be formed by conventional methods. Different film forming methods may be applied for respective layer. It is preferable to use wet process for the emitting layer for stable production ability since the emitting layer contains small amount of emitting material in this invention.

After formation of these layers, a thin film composed of cathode materials is formed on the resulting layers to reach a film thickness of at most 1 μm but preferably in the range of 50 to 200 nm, employing a method such as vapor deposition or sputtering, whereby a cathode is provided. Thus, an intended organic EL element is prepared by providing the cathode.

Further, the above preparation order may be reversed, and preparation may be conducted in the order of the cathode, the electron injecting layer, the electron transporting layer, the light emitting layer, the positive hole injecting layer, and the anode. When direct current voltage is applied to the multi-color display device prepared as above, a voltage of 2 to 40 V is applied while the anode is employed at positive polarity, and the anode is employed at negative polarity, whereby it is possible to observe light emission. Further, alternating current voltage may be applied, of which waveform of the applied alternating current is not limited.

<<Application>>

It is possible to employ the organic EL element of the present invention as display devices, displays, and various light emitting sources. Examples of light emitting sources include home lighting, lighting in vehicles, backlights for clocks and liquid crystals, advertising boards, traffic lights, light sources for optical memory media, light sources for electrophotographic copiers, light sources for optical communication processors, and light sources for optical sensors, but are not limited thereto. Specifically, it is possible to effectively employ it as a backlight for various display devices combined with a color filter, a light diffusing plate, or a light bringing-out film, and light sources for lighting.

The organic electroluminescent panel may be provided with patterning by a metal mask or ink jet printing method during manufacturing process if required in this invention. Patterning is conducted for an electrode only, an electrode and an emitting layer or whole panel.

A lighting device, to which the organic EL element of the present invention is applied, will now be described.

The organic EL element of the present invention may be employed as a type of lamps for lighting or an exposure light source. Further, it may be employed as a display for the type in which still images as well as moving images are directly visible. A driving system, when employed as a display device for reproducing moving images, may be either a simple matrix (a passive matrix) system or an active matrix system.

The white organic electroluminescent element employed in the present invention, if desired, may be subjected to patterning during film making, employing a metal mask or an ink-jet printing method. The electrode and the light emitting layer may be subjected patterning, or all element layers may be subjected to patterning.

Light emitting dopants employed in the light emitting layer are not particularly limited. For example, in the case of a backlight in a liquid crystal display element, whiteness will be realized by combining any of those selected from the light emitting dopants according to this invention and light emitting dopants known in the art to be suitable for the wavelength region corresponding to CF (color filter) characteristics, or combining light taking-out and/or light focusing sheets according to the present invention.

The white organic EL element of the present invention is preferred due to the following reasons. It is thereby possible to prepare a full-color organic electroluminescent display by obtaining blue light, green light, and red light via a blue filter, a green filter, and a red filter, respectively, employing, as a backlight, white light emitted from the organic electroluminescent panel, by arranging the element and the driving transistor circuit by combining it with a CF (color filter) or matching it to a CF (color filter) pattern.

<<Industrial Fields to which the Organic EL Element of the Present Invention is Applicable>>

It is possible to employ the organic EL element of the present invention as display devices, displays, and various light emitting sources. Examples of light emitting sources include home lighting, lighting in vehicles, backlights for clocks and liquid crystals, advertising boards, traffic lights, light sources for optical memory media, light sources for electrophotographic copiers, light sources for optical communication processors, and light sources for optical sensors, but are not limited thereto. Specifically, it is possible to effectively employ it as a backlight for various display devices combined with a color filter, a light diffusing plate, or a light bringing-out film, and light sources for lighting.

EXAMPLE

The present invention will now specifically be described, however the present invention is not limited thereto.

Example

Transparent ITO electrode was provided to have a thickness of 150 nm via sputtering apparatus on no alkali glass substrate obtained from market. ITO patterning was conducted via photolithography so as to obtain light emitting part of 10 mm×10 mm size, and substrate was prepared.

The obtained substrate was washed via ultrasonic with iso-propyl alcohol, dried by dry nitrogen gas, and was subjected to UV ozone washing for 5 minutes.

The glass substrate was set on a spin coater on the market, a positive hole injection layer was provided by coating positive hole injection layer PEDOT (PEDOT/PSS, manufactured by Bayer A.G., Baytron P Al 4083) via spin coat (thickness of around 40 nm), and heated for one hour at 200° C. by a hot plate. The following white light emitting composition was prepared to have a volume of 1 ml, and coated by spin coater so as to have thickness of around 25 nm.

White Light Emitting Composition

| | |
|---|---|
| Solvent: toluene | 100% by weight |
| Host material: H-1 | 1% by weight |
| Blue color material: Ir-A | 0.10% by weight |
| Green color material: Ir(ppy)$_3$ | 0.004% by weight |
| Red color material: Ir(piq)$_3$ | 0.005% by weight |

The substrate was washed and fixed to substrate holder of a vacuum evaporator on the market. In evaporation crucibles in the evaporator E-1 and CsF were respectively filled so as to have optimum amount. Evaporation was conducted under a reduced pressure of $4\times10^{-1}$ Pa and a positive hole blocking layer (E-1, thickness of 5 nm) and an electron transporting layer (E-1, CsF (20%), thickness of 45 nm) were vapor deposited.

Next, aluminum was deposited to have a thickness of 100 nm to form a cathode, whereby an organic EL element was prepared.

H-1

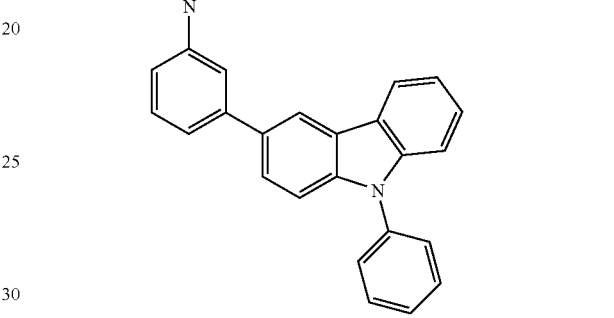

E-1

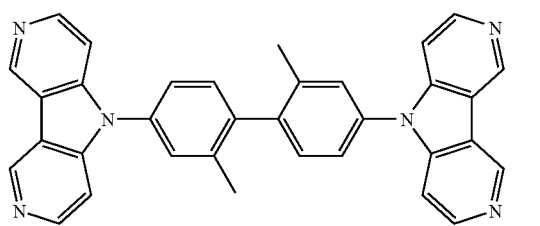

Ir-A

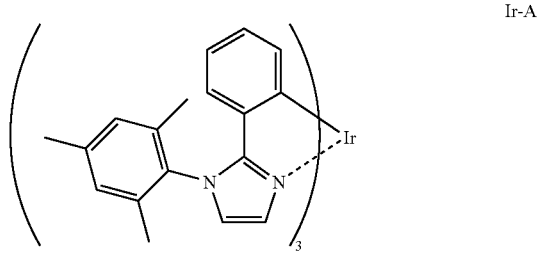

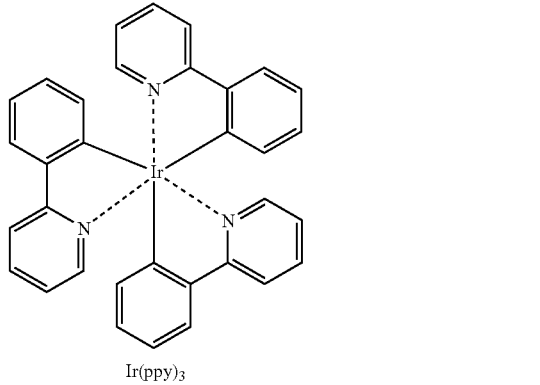

Ir(ppy)$_3$

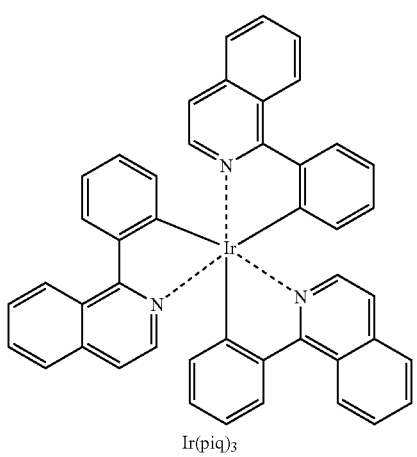

Ir(piq)₃

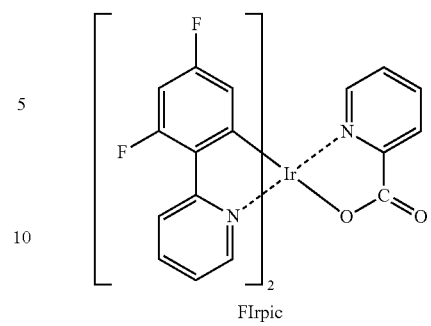

FIrpic

Comparative Example

Transparent ITO electrode was provided to have a thickness of 150 nm via sputtering apparatus on no alkali glass substrate obtained from market. ITO patterning was conducted via photolithography so as to obtain light emitting part of 10 mm×10 mm size, and substrate was prepared.

The obtained substrate was washed via ultrasonic with iso-propyl alcohol, dried by dry nitrogen gas, and was subjected to UV ozone washing for 5 minutes.

The glass substrate was set on a spin coater on the market, a positive hole injection layer was provided by coating positive hole injection layer PEDOT (PEDOT/PSS, manufactured by Bayer A.G., Baytron P Al 4083) via spin coat (thickness of around 40 nm), and heated for one hour at 200° C. by a hot plate. The following white light emitting composition was prepared to have a volume of 1 ml, and coated by spin coater so as to have thickness of around 25 nm.

White Light Emitting Composition

| Solvent: toluene | 100% by weight |
| Host material: H-1 | 1% by weight |
| Blue color material: FIrpic | 0.10% by weight |
| Green color material: Ir(ppy)₃ | 0.0008% by weight |
| Red color material: Ir(piq)₃ | 0.0008% by weight |

The substrate was washed and fixed to substrate holder of a vacuum evaporator on the market. In evaporation crucibles in the evaporator E-1 and CsF were respectively filled so as to have optimum amount. Evaporation was conducted under a reduced pressure of $4 \times 10^{-1}$ Pa and a positive hole blocking layer (E-1, thickness of 5 nm) and an electron transporting layer (E-1, CsF (20%), thickness of 45 nm) were vapor deposited.

Next, aluminum was deposited to have a thickness of 100 nm to form a cathode, whereby an organic EL element was prepared.

(Calculation of HOMO)

HOMO levels of the blue, green, red materials were calculated. The values of the HOMO levels were calculated using Gaussian 98 (Gaussian 98, Revision A. 11. 4, M. J. Frisch, et al, Gaussian, Inc., Pittsburgh Pa., 2002), which is software for a molecular orbital calculation, and produced by Gaussian Inc. The HOMO levels of the emitting materials (dopants) were calculated by employing B3LYP/LanL2DZ as a key word.

TABLE 2

| Light Emitting Material | HOMO (eV) |
|---|---|
| Ir-A | −4.33 |
| FIrpic | −5.99 |
| Ir(ppy)₃ | −4.95 |
| Ir(piq)₃ | −4.90 |

White compositions of the Example and Comparative Example were prepared four times, and elements were prepared. Chromaticity xy (CIE 1931 chromaticity diagram) at 1,000 cd/m² is show.

TABLE 3

| | Example | | Comparative Example | |
|---|---|---|---|---|
| | x | y | x | y |
| 1st time | 0.37 | 0.37 | 0.37 | 0.35 |
| 2nd time | 0.37 | 0.37 | 0.34 | 0.38 |
| 3rd time | 0.37 | 0.37 | 0.40 | 0.36 |
| 4th time | 0.37 | 0.37 | 0.38 | 0.35 |

No difference of chromaticity between the samples of the Example of the invention was observed when elements were prepared several times. Difference of chromaticity between the samples of the Comparative Example.

The invention claimed is:

1. An organic electroluminescent element comprising a substrate and, provided on the substrate, at least an anode, a cathode, and a light emitting layer held between the anode and the cathode, and emitting white light, wherein the light emitting layer contains at least three types of light emitting materials different from each other in λ max, and an absolute value of HOMO level of the light emitting material having a shortest wavelength is smaller than an absolute value of HOMO level of other light emitting materials, and wherein the light emitting material having the shortest wavelength is a phosphorescent compound represented by Formula (1)

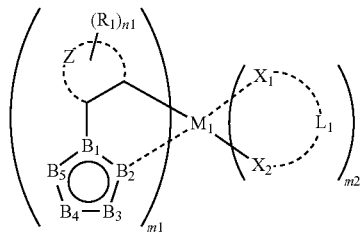

Formula (1)

wherein $R_1$ represents a substituent; Z represents a group of non-metallic atoms which are necessary to form a 5 to 7 member ring; n1 represents an integer of 0 to 5; $B_1$ through $B_5$ each represents a carbon atom, a nitrogen atom, an oxygen atom, or a sulfur atom, while at least one of $B_1$ through $B_5$ represents a nitrogen atom; $M_1$ represents a metal in Groups 8 to 10 of the element periodic table; each of $X_1$ and $X_2$ represents a carbon atom, a nitrogen atom, or an oxygen atom; $L_1$ represents a group of atoms which form a bidentate ligand together with $X_1$ and $X_2$; m1 represents an integer of 1, 2, or 3; and m2 represents an integer of 0, 1, or 2, while m1+m2 is 2 or 3.

2. The organic electroluminescent element of claim 1, wherein the at least three types of light emitting materials emit colors within the visible spectrum corresponding to blue, green and red.

3. The organic electroluminescent element of claim 2, wherein a content of the light emitting material having the longest wavelength is 0.1 to 20% by weight based on a content of the light emitting material having the shortest wavelength.

4. The organic electroluminescent element of claim 2, wherein the absolute value of HOMO level of the light emitting material having the shortest wavelength is not more than 4.4 eV.

5. The organic electroluminescent element of claim 2, wherein a thickness of the light emitting layer is not less than 15 nm.

6. The organic electroluminescent element of claim 1, wherein the light emitting material having the longest wavelength is 0.1 to 20% by weight based on a content of the light emitting material having the shortest wavelength.

7. The organic electroluminescent element of claim 6, wherein the absolute value of HOMO level of the light emitting material having the shortest wavelength is not more than 4.4 eV.

8. The organic electroluminescent element of claim 6, wherein a thickness of the light emitting layer is not less than 15 nm.

9. The organic electroluminescent element of claim 1, wherein the absolute value of HOMO level of the light emitting material having the shortest wavelength is not more than 4.4 eV.

10. The organic electroluminescent element of claim 9, wherein a thickness of the light emitting layer is not less than 15 nm.

11. The organic electroluminescent element of claim 1, wherein the light emitting layer is produced by a coating process.

12. The organic electroluminescent element of claim 11, wherein a thickness of the light emitting layer is not less than 15 nm.

13. The organic electroluminescent element of claim 1, wherein each one of the least three types of light emitting materials is a phosphorescent compound.

14. The organic electroluminescent element of claim 13, wherein a thickness of the light emitting layer is not less than 15 nm.

15. The organic electroluminescent element of claim 1, wherein a thickness of the light emitting layer is not less than 15 nm.

* * * * *